United States Patent
Iguchi et al.

(10) Patent No.: US 7,999,231 B2
(45) Date of Patent: Aug. 16, 2011

(54) MOISTURE DETECTOR, BIOLOGICAL BODY MOISTURE DETECTOR, NATURAL PRODUCT MOISTURE DETECTOR, AND PRODUCT/MATERIAL MOISTURE DETECTOR

(75) Inventors: Yasuhiro Iguchi, Osaka (JP); Youichi Nagai, Osaka (JP)

(73) Assignee: Sumitomo Electric Inductries, Ltd., Osaka-Shi (JP)

( * ) Notice: Subject to any disclaimer, the term of this patent is extended or adjusted under 35 U.S.C. 154(b) by 259 days.

(21) Appl. No.: 12/508,008

(22) Filed: Jul. 23, 2009

(65) Prior Publication Data

US 2010/0051905 A1 Mar. 4, 2010

(30) Foreign Application Priority Data

Aug. 29, 2008 (JP) ................................ 2008-222192

(51) Int. Cl.
*G01J 5/20* (2006.01)
(52) U.S. Cl. ............... 250/339.1; 250/338.1; 250/338.4; 250/339.11; 250/341.8; 257/461; 257/E31.003
(58) Field of Classification Search ............... 250/338.1, 250/338.4, 339.1, 339.11, 341.8; 257/80, 257/290, 431, 461, 463, E31.001, E31.033, 257/E31.057, E31.067, E31.093
See application file for complete search history.

(56) References Cited

U.S. PATENT DOCUMENTS

| | | | | |
|---|---|---|---|---|
| 6,153,995 | A | * | 11/2000 | Tanaka ........................... 318/483 |
| 2008/0142714 | A1 | | 6/2008 | Nagai et al. |

FOREIGN PATENT DOCUMENTS

| | | |
|---|---|---|
| JP | 63-001079 | 1/1988 |
| JP | 03-038887 | 2/1991 |
| JP | 5-34281 | 2/1993 |
| JP | 05-160426 | 6/1993 |
| JP | 05-160429 | 6/1993 |
| JP | 6-86902 | 3/1994 |
| JP | 7-159314 | 6/1995 |
| JP | 7-260680 | 10/1995 |

(Continued)

OTHER PUBLICATIONS

Yamamoto, A. et al. "Optical Properties of $GaAs_{0.5}Sb_{0.5}$ and $In_{0.53}Ga_{0.47}As/GaAs_{0.5}Sb_{0.5}$ Type II Single Hetero-Structures Lattice-Matched to InP Substrates Grown by Molecular Beam Epitaxy," Journal of Crystal Growth 201/202, pp. 872-876 (1999).

(Continued)

*Primary Examiner* — Tom Thomas
*Assistant Examiner* — Eduardo A. Rodela
(74) *Attorney, Agent, or Firm* — Venable LLP; Michael A. Sartori; Steven J. Schwarz

(57) ABSTRACT

A moisture detector includes a light-receiving element including an absorption layer having a pn-junction, or an array of the light-receiving elements, wherein the absorption layer has a multiquantum well structure composed of a Group III-V semiconductor, the pn-junction is formed by selectively diffusing an impurity element into the absorption layer, and the concentration of the impurity in the absorption layer is $5 \times 10^{16}/cm^3$ or less. The moisture detector receives light having at least one wavelength included in an absorption band of water lying in a wavelength range of 3 μm or less, thereby detecting moisture.

15 Claims, 21 Drawing Sheets

FOREIGN PATENT DOCUMENTS

| | | |
|---|---|---|
| JP | 8-86749 | 4/1996 |
| JP | 9-219563 | 8/1997 |
| JP | 10-118108 | 5/1998 |
| JP | 11-9897 | 1/1999 |
| JP | 2001-116689 | 4/2001 |
| JP | 2001-144278 | 5/2001 |
| JP | 2003-344278 | 12/2003 |
| JP | 2003-344279 | 12/2003 |
| JP | 2006-270060 | 10/2006 |
| JP | 2007-10584 | 1/2007 |
| JP | 2007-080920 | 3/2007 |
| JP | 2007-201432 | 8/2007 |
| JP | 2007-324572 | 12/2007 |
| JP | 2008-153311 | 7/2008 |
| JP | 2008-171885 | 7/2008 |
| JP | 2008-205001 | 9/2008 |
| JP | 2008-270760 | 11/2008 |
| JP | 2008-288293 | 11/2008 |
| WO | WO-2007/120931 A1 | 10/2007 |

OTHER PUBLICATIONS

Murakami et al., "$In_xGa_{1-x}As/InAs_yP_{1-y}$ detector for near infrared (1-2.6 μm)", Conference Proceedings of Indium Phosphide and Related Materials May 1995, Sapporo, pp. 528-531.

Sidhu, "A long-wavelength photodiode on InP using lattice-matched GaInAs-GaAsSb type-II quantum wells", IEEE Photonics Technology Letters, vol. 17, No. 12 (2005), pp. 2715-2717.

\* cited by examiner

Melon M

Moisture distribution image of face

S (Nail, hair, cutis, etc.)

MOISTURE DETECTOR, BIOLOGICAL BODY MOISTURE DETECTOR, NATURAL PRODUCT MOISTURE DETECTOR, AND PRODUCT/MATERIAL MOISTURE DETECTOR

BACKGROUND OF THE INVENTION

1. Field of the Invention

The present invention relates to a moisture detector, a biological body moisture detector, a natural product moisture detector, and a product/material moisture detector. More specifically, the present invention relates to a moisture detector, a biological body moisture detector, a natural product moisture detector, and a product/material moisture detector that include a light-receiving element having a high sensitivity to a long-wavelength region of the near-infrared region without cooling.

2. Description of the Related Art

Moisture, biological components, medicines, environmental materials, and the like have an absorption band in the near-infrared region, and thus near-infrared spectroscopy has attracted attention as a noninvasive analytical method, and studies and practical applications thereof have been intensively performed. In addition, cosmic light reaching the ground during the day and night has a plurality of emission bands in the near-infrared region. Therefore, studies and practical applications of a method of capturing an image of light reflected from an object on the ground have been performed for commercial and military applications. In the analysis performed by near-infrared spectroscopy, output signals include necessary information and a large amount of noise due to characteristics of a light-receiving element. Accordingly, in order to extract necessary information from output signals without completely depending on an improvement in the performance of sensors (light-receiving elements), spectroscopic methods, chemometrics, and the like have been employed as important methods.

In the near-infrared region, the above sensors (light-receiving elements) are broadly divided into electron tubes and photodiodes (hereinafter also referred to as "PDs") which are solid-state components. Among these sensors, research and development of PDs has been widely performed because PDs have a small size and can be easily highly integrated to form a one-dimensional array, a two-dimensional array, or the like. The present invention relates to a moisture detector including a PD. Currently, the following PDs or PD arrays are used. (1) An example such PDs or PD arrays is PDs or arrays thereof having a light-receiving sensitivity to the infrared region and also having a light-receiving sensitivity in the near-infrared region. Specific examples of such a photodiodes include a Ge-based PD, a PbS-based PD, an HgCdTe-based PD, one-dimensional arrays thereof, and two-dimensional arrays thereof. (2) Another example of such PDs or PD arrays is InP-based PDs, InGaAs-based PDs included in the category of the InP-based PDs, and arrays thereof. These photodiodes have a light-receiving sensitivity at a wavelength of 1.7 μm or less in the near-infrared region. Herein, the term "InP-based PDs" means PDs including an absorption layer made of a Group III-V compound semiconductor and provided on an InP substrate, and InGaAs-based PDs are also included in the InP-based PDs.

Among the above photodiodes, photodiodes described in (1) are often cooled in order to reduce noise. For example, most of the photodiodes are operated at the liquid nitrogen temperature (77 K) or using a Peltier device. Accordingly, commercial devices including such photodiodes have a large size, and thus the photodiodes described in (1) are not suitable for handy-type or shoulder-type portable near-infrared spectrometers, digital cameras, or the like. However, among such photodiodes, there is a sensor, e.g., a lead sulfide (PbS) sensor, that can be operated at room temperature. However, even when lead sulfide is used, the wavelength range in which light can be received is limited at room temperature. On the other hand, the InP-base PDs described in (2) have the following disadvantages: (I) In InGaAs, which is lattice-matched to InP, a dark current is low, but the light-receiving sensitivity is limited to a wavelength range of 1.7 μm of less in the near-infrared region. (II) In extended InGaAs wherein the wavelength region in which light can be received is extended to 2.6 μm, the dark current is high, and cooling is necessary. Accordingly, in the InP-based PDs, light having a wavelength at about 1.9 μm in a large absorption band of water cannot be used or it is necessary to cool the sensor in order to use the light.

Examples of light-receiving elements used in moisture detection to date will be described below. (C1) In a known method, among absorption bands of water, an absorption band of a wavelength in the range of 1.8 to 1.95 μm is used for measuring the moisture content by using PbS at room temperature (Japanese Unexamined Patent Application Publication Nos. 6-86902 and 2003-344279). (C2) A method of forming an image by light having a wavelength in the range of 1.2 to 2 μm with an infrared imaging detector has been disclosed (Japanese Unexamined Patent Application Publication Nos. 5-34281 and 2001-116689). Although the structure of the infrared imaging detector is not clearly described in this method, it is believed that a two-dimensional array of PbS-based PDs cooled using liquid nitrogen or a Peltier device is used. (C3) A measuring device including an InGaAs PIN photodiode has also been disclosed (Japanese Unexamined Patent Application Publication Nos. 8-86749 and 2007-10584). In addition, a method of detecting moisture using an InGaAs PIN photodiode, which is assumed from the wavelength region used, has been proposed (Japanese Unexamined Patent Application Publication No. 11-9897). (C4) The type of an element used as an infrared detector is not specifically described in some patent documents (Japanese Unexamined Patent Application Publication Nos. 7-260680, 7-159314, 2003-344278, and 10-118108). In these cases, considering the description that a name of "infrared sensor" or "infrared detector" is used for a light-receiving portion (i.e., an element that generates a voltage by receiving infrared rays) and from the wavelength used in the measurement, it is believed that lead sulfide described in (C1) above or a similar substance is probably used.

InGaAs PIN photodiodes have a problem that the light-receiving sensitivity must be extended to the long-wavelength side of the near-infrared region. However, this problem has not yet been satisfactorily solved in that noise and a dark current are suppressed while extending the light-receiving sensitivity to a wavelength of 1.7 μm or more (T. Murakami, H. Takahashi, M. Nakayama, Y. Miura, K. Takemoto, and D. Hara, "$In_xGa_{1-x}As/InAs_yP_{1-y}$ detector for near infrared (1 to 2.6 μm)", Conference Proceedings of Indium Phosphide and Related Materials 1995, May, Sapporo, pp. 528-531 (Ref. 1), R. Sidhu, "A Long-Wavelength Photodiode on InP Using Lattice-Matched GaInAs—GaAsSb Type-II Quantum Wells, IEEE Photonics Technology Letters, Vol. 17, No. 12 (2005), pp. 2715-2717 (Ref. 2), and Japanese Unexamined Patent Application Publication Nos. 9-219563 and 2001-144278).

As described in Japanese Unexamined Patent Application Publication Nos. 10-118108 and 9-219563 and Refs. 1 and 2, whose descriptions are omitted, there are some candidates for a light-receiving element and a light-receiving element array which does not require cooling with liquid nitrogen or a Peltier device and which has a light-receiving sensitivity at the long-wavelength side of the near-infrared region. However, there are many difficult problems to be overcome to realize practical use, for example, low crystallinity, a high dark current, and the difficulty of production, and thus such a light-receiving element and a light-receiving element array are still under development. Therefore, in a measurement using a photodiode not including a cooling mechanism, noise increases, and thus it is difficult to perform a measurement with a high accuracy. This problem becomes particularly serious in a detection of a very small amount of moisture.

In the above methods of analyzing moisture described in the above cited references, there is no reference to the sensitivity of a light-receiving element itself. All the references propose a preferable analytical method of moisture in accordance with properties of an object containing moisture. However, it is very significant that the performance of a light-receiving element itself is improved to realize a moisture detector suitable for a test object in accordance with the feature of the improvement in the performance. Specifically, if near-infrared spectroscopy can be performed using a photodiode in which a dark current is suppressed without using a cooling mechanism, useful information can be easily obtained with a high sensitivity. As a result, a development in many application fields of the photodiode can be promoted.

SUMMARY OF THE INVENTION

Accordingly, it is an object of the present invention to provide a moisture detector configured to detect moisture with a high sensitivity using an InP-based photodiode in which a dark current is decreased without a cooling mechanism and the light-receiving sensitivity is extended to a wavelength of 1.7 μm or more, and a biological body moisture detector, a natural product moisture detector, and a product/material moisture detector that include the same.

A moisture detector of the present invention is a moisture detector configured to detect moisture in a test object and includes a light-receiving element including a Group III-V semiconductor laminated structure including an absorption layer having a pn-junction, or an array of the light-receiving elements. In this moisture detector, the absorption layer has a multiquantum well structure composed of a Group III-V semiconductor, and the pn-junction is formed by selectively diffusing an impurity element into the absorption layer. The concentration of the impurity in the absorption layer is $5\times10^{16}/cm^3$ or less, and, the moisture detector has a sensitivity to light having at least two wavelength ranges selected from a first wavelength range of 1.35 μm or more and less than 1.8 μm, a second wavelength range of 1.8 μm or more and less than 2.0 μm, and a third wavelength range of 2.5 μm or more and less than 3.0 μm, the light being reflected from the test object. The moisture detector detects moisture using light in at least one wavelength range selected from the wavelength ranges in which the moisture detector has the sensitivity.

According to the above structure, the concentration of the impurity in the multiquantum well structure having a bandgap energy corresponding to the near-infrared region is decreased to $5\times10^{16}/cm^3$ or less. Thereby, the multiquantum well structure can be formed without being broken, that is, without degrading the crystallinity. In addition, the impurity for forming the pn-junction of the light-receiving elements is selectively diffused. Specifically, the impurity is introduced into the inside of a peripheral portion of each light-receiving element so that the diffusion in the peripheral portion is two-dimensionally limited. Thus, the impurity is introduced so as to be separately present in each of the light-receiving elements. Accordingly, each of the light-receiving elements can be easily formed with a high accuracy and element isolation trenches need not be provided, and thus light-receiving elements in which a dark current is low can be formed.

Therefore, light can be received over a wavelength range of 1 to 3 μm with a high sensitivity without cooling. In the absorption band of water in the near-infrared range, any wavelength in an absorption band selected from a first absorption band (having an absorption peak at about 1.4 μm), a second absorption band (having an absorption peak at about 1.9 μm), and a third absorption band (which is a broad absorption band having a peak at about 2.9 μm and ranging from 2.3 μm to 3 μm or more) can be used. Herein, the term "detect" means that a calibration curve (the relationship between the water concentration and the intensity or the absorbance of light at the wavelength) is prepared in advance, and the water concentration or the moisture content is determined.

The pn-junction mentioned above should be widely read as follows. The pn-junction is an impurity region (referred to as "i-region") in the absorption layer where the impurity concentration in an area of a surface side, the surface opposite a surface into which an impurity is introduced by selective diffusion, is low enough to be considered as an intrinsic semiconductor. In addition, the pn-junction also includes a junction formed between the impurity region formed by the selective diffusion and the above-mentioned i-region. That is, the above pn-junction may be a pi-junction, an ni-junction, or the like. Furthermore, the pn-junction also includes the case where the p concentration in the pi-junction or the n concentration in the ni-junction is very low.

The above moisture detector can detect moisture using light in at least one wavelength range selected from a first wavelength range of 1.35 μm or more and less than 1.8 μm, a second wavelength range of 1.8 μm or more and less than 2.0 μm, and a third wavelength range of 2.5 μm or more and less than 3.0 μm. Accordingly, in the case where a wavelength in an absorption band of a material constituting a test object overlaps with a wavelength in the absorption band of water, and thus a measurement with a high accuracy cannot be performed, or in other cases, an appropriate wavelength range for performing a highly accurate measurement is selected, and moisture can be detected using light in the selected wavelength range.

The Group III-V semiconductor laminated structure may be disposed on a Group III-V semiconductor substrate. The Group III-V semiconductor laminated structure may include a Group III-V semiconductor layer for adjusting the concentration distribution of the diffused impurity, the layer being disposed on a surface of the absorption layer, the surface being opposite the substrate. The bandgap energy of the layer for adjusting the concentration distribution of the diffused impurity is preferably smaller than the bandgap energy of the Group III-V semiconductor substrate. In this case, even when the impurity concentration in an area of the layer for adjusting the concentration distribution of the diffused impurity, the area being disposed at the absorption layer side and extending in the thickness direction, is decreased, since the bandgap energy of the layer for adjusting the concentration distribution of the diffused impurity is small, and thus it is possible to control the electrical resistance of the area so as not to be higher than that in the case where a material having a bandgap energy of the Group III-V semiconductor substrate is used.

Here, more specific characteristics of the layer for adjusting the concentration distribution of the diffused impurity, the layer having a bandgap energy smaller than the bandgap energy of the substrate, and the reasons why the characteristics are necessary are as follows: (1) In the case where an absorption layer for a near-infrared region at a longer-wavelength side is formed of a Group III-V compound semiconductor, a material having a bandgap energy larger than the bandgap energy of the absorption layer may be used for a window layer. In such a case, the same material as the semiconductor substrate is often used as the window layer in view of a lattice matching property etc. It is assumed that the bandgap energy of the layer for adjusting the concentration distribution of the diffused impurity is smaller than the bandgap energy of the window layer and larger than the bandgap energy of the absorption layer. The reason for this is as follows. If the bandgap energy of the layer for adjusting the concentration distribution of the diffused impurity is smaller than the bandgap energy of the absorption layer, in the case where a structure in which the top surface of an epitaxial layer functions as an incident surface is employed, the layer for adjusting the concentration distribution of the diffused impurity absorbs the target light, thereby decreasing the light-receiving sensitivity of the absorption layer. (2) A material having a bandgap energy smaller than a large bandgap energy of a material that is generally used as a window layer is used as the layer for adjusting the concentration distribution of the diffused impurity. Thereby, even when the impurity concentration is low, the degree of increase in the electrical resistance or the degree of decrease in the electrical conductivity can be decreased. As a result, as described above, a decrease in a response speed can be suppressed in a voltage-applied state.

In the layer for adjusting the concentration distribution of the diffused impurity, the concentration of the impurity element may decrease from a range of $1 \times 10^{18}/cm^3$ to $3 \times 10^{19}/cm^3$ at a surface side, the surface being opposite a surface adjacent to the absorption layer, to $5 \times 10^{16}/cm^3$ or less at the absorption layer side. In this case, satisfactory crystallinity of the multiquantum well structure can be ensured while reducing an interface resistance of an electrode disposed at the top surface side or allowing an ohmic contact to be formed. The problem of an increase in the electrical resistance or a decrease in the electrical conductivity due to a low impurity concentration in the area of the layer for adjusting the concentration distribution of the diffused impurity can be reduced by controlling the bandgap energy of the layer for adjusting the concentration distribution of the diffused impurity to be smaller than the bandgap energy corresponding to that of InP, as described above.

The multiquantum well structure constituting the absorption layer may have a type-II quantum well structure. In this case, a light-receiving element having a light-receiving sensitivity at a long-wavelength side of the near-infrared region can be easily realized by selecting two appropriate Group III-V semiconductor materials.

The Group III-V semiconductor laminated structure may be disposed on an InP substrate, and the absorption layer may have an InGaAs/GaAsSb multiquantum well structure or a GaInNAs/GaAsSb multiquantum well structure. In this case, a light-receiving element having good crystallinity and in which a dark current is low can be easily produced using materials and techniques that have been accumulated to date.

The InP substrate may be an off-angle substrate which is tilted from (100) in the [111] direction or the [11-1] direction by 5 to 20 degrees. In this case, a laminate including an absorption layer having a multiquantum well structure with a low defect density and good crystallinity can be obtained. As a result, a dark current can be suppressed.

The impurity element may be zinc (Zn), and the layer for adjusting the concentration distribution of the diffused impurity may be composed of InGaAs. In this case, the layer for adjusting the concentration distribution of the diffused impurity can be formed of a material in which the dependency of the electrical resistance on the impurity concentration is small and whose electrical resistance is not significantly increased even when the impurity concentration is low. The suppression of an increase in the electrical resistance can prevent a response speed from decreasing. In addition, many studies on selective diffusion using Zn as an impurity have been conducted to date, and thus a diffusion region can be formed with a high accuracy. Consequently, in the layer for adjusting the concentration distribution of the diffused impurity, the concentration of the impurity is made to high at the upper side in which the impurity is introduced by diffusion, and the concentration of the impurity is made to low at the lower side adjacent to the absorption layer, and thus an increase in the electrical resistance at the lower side can be prevented. Therefore, the formation of a region containing the impurity at a high concentration can be prevented in the absorption layer having a quantum well structure. As a result, a light-receiving element having a quantum well structure with good crystallinity can be produced without decreasing responsiveness. Note that the bandgap energy of InGaAs is 0.75 eV.

An InP window layer may be provided on the layer for adjusting the concentration distribution of the diffused impurity. The formation of the InP window layer does not degrade the crystallinity of the semiconductor laminate structure. Therefore, in the case where a structure in which the top surface of an epitaxial layer functions as an incident surface is employed, the window layer effectively functions to suppress a dark current while preventing, for example, near-infrared light from being absorbed in a portion disposed nearer to the incident surface than the absorption layer. In addition, many studies on a technique for forming a passivation film on a surface of InP crystals have been performed and technically established, as compared with studies on a technique for forming a passivation film on a surface of other crystals, for example, on a surface of InGaAs crystals. Accordingly, current leakage on the surface can be easily suppressed.

Here, the light-receiving element array is formed so that a plurality of light-receiving elements include a common semiconductor laminated structure, an impurity element is selectively diffused in the absorption layer for each of the light-receiving elements, and the light-receiving elements are arranged one-dimensionally or two-dimensionally. According to this structure, since the light-receiving elements are formed so as to have the individual impurity diffusion regions, element isolation trenches need not be provided. Therefore, a light-receiving element array which can be easily formed with a high accuracy and in which a dark current can be decreased can be formed.

The moisture detector may further include a spectral separation unit configured to spectrally separate light, the spectral separation unit being disposed in front of or at the back of the test object; a plurality of the light-receiving elements or an array of the light-receiving elements arranged so as to correspond to wavelengths obtained by the spectral separation; and a control unit configured to perform an operation on the basis of the results of light reception performed by the light-receiving elements or the array of the light-receiving elements to calculate the moisture content. In this case, for example, a simultaneous multiwavelength detection can be rapidly performed with a high accuracy. The spectral separation unit is preferably composed of a diffraction grating or the like. The control unit may include a memory unit, an input unit from the outside, and other components, and, for example, a calibration curve of a target wavelength may be input and stored in advance.

The moisture detector may include an imaging device including a two-dimensional array of the light-receiving elements, and a moisture distribution image of the test object may be formed with the imaging device. Accordingly, a moisture distribution image of the test object that can be easily understood in terms of perception can be obtained.

The moisture detector may not include an artificial light source. A light-receiving portion of this moisture detector has a reduced amount of noise and a good sensitivity, and thus, for example, short-wavelength infrared region (SWIR) cosmic light can be used as a light source. The SWIR cosmic light is constantly emitted during the day and night from the space to the earth. Accordingly, for some objects to be detected, the SWIR cosmic light may be used as a light source, and an artificial light source may not be particularly provided.

A supercontinuum light source (SC light source) or a light-emitting diode (LED) may be used as a light source. In general, a halogen lamp is used as a light source. Since such a halogen lamp generates heat, irradiation of the halogen lamp causes evaporation of moisture. Therefore, halogen lamps are not suitable for a measurement of the moisture content. In contrast, an SC light source and an LED do not generate heat, and thus are suitable for a light source used in a measurement of the moisture content.

A biological body moisture detector of the present invention includes any one of the above-described moisture detectors and detects moisture in a biological body. Accordingly, moisture in a biological body can be detected with a high accuracy. The biological body includes living organisms in general, such as animals including human, fishes, birds, insects, and reptiles, and portions constituting these living organisms.

A natural product moisture detector according to the present invention includes any one of the above-described moisture detectors and detects moisture in a natural product. The natural product is included in the above biological bodies, but the natural product herein particularly includes products generated as a result of activities of agriculture, forestry, and fishery such as agricultural and marine products among the biological bodies. Accordingly, moisture in a natural product generated by the activities of agriculture, forestry, and fishery can be detected with a high accuracy.

A product/material moisture detector of the present invention includes any one of the above-described moisture detectors and detects moisture in a product or a material such as a raw material, an intermediate product, a product, a commodity, or a waste product, which is a target of an industrial activity. Accordingly, moisture in all products and materials which are targets of industrial activities can be detected with a high accuracy.

The present invention can provide a moisture detector configured to detect moisture with a high sensitivity using an InP-based photodiode in which a dark current is decreased without a cooling mechanism and the light-receiving sensitivity is extended to a wavelength of 1.7 µm or more. More specifically, the present invention can provide a biological body moisture detector, a natural product moisture detector, and a product/material moisture detector that include the same.

DESCRIPTION OF THE PREFERRED EMBODIMENTS

First Embodiment

Structure of Semiconductor Light-Receiving Element Array

Figure 1:
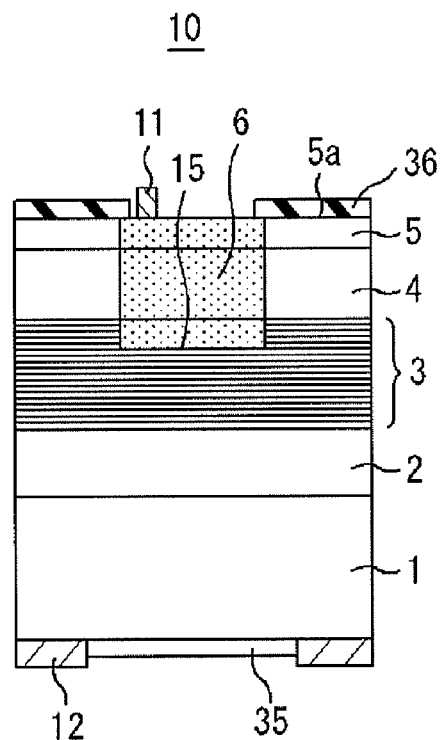
FIG. 1 is a cross-sectional view showing a light-receiving element according to a first embodiment of the present invention.

FIG. 1 is a cross-sectional view showing a light-receiving element 10 according to an embodiment of the present invention. Referring to FIG. 1, the light-receiving element 10 includes a Group III-V semiconductor laminated structure (epitaxial wafer) provided on a InP substrate 1. Specifically, the light-receiving element 10 has the following laminated structure:
(InP substrate 1, InP buffer layer 2, absorption layer 3 having a multiquantum well structure composed of InGaAs or GaInNAs and GaAsSb, InGaAs layer 4 for adjusting a concentration distribution of a diffused impurity, and InP window layer 5)

A p-type region 6 extending from the InP window layer 5 to the absorption layer 3 having the multiquantum well structure is formed by selectively diffusing Zn which is a p-type impurity from an opening of a selective diffusion mask pattern 36 composed of a SiN film. By performing diffusion using the selective diffusion mask pattern 36 composed of the SiN film, the p-type impurity can be introduced into the inside of the peripheral portion of the light-receiving element 10 by diffusion so that the diffusion in the peripheral portion is two-dimensionally limited. A p-side electrode 11 made of AuZn is provided on the p-type region 6, and an n-side electrode 12 made of AuGeNi is provided on the reverse face of the InP substrate 1. Each of the p-side electrode 11 and the n-side electrode 12 is provided so as to form an ohmic contact. In this case, the InP substrate 1 is doped with an n-type impurity to ensure a conductivity at a predetermined level. An antireflection film 35 made of SiON is provided on the reversed face of the InP substrate 1 so that the light-receiving element 10 can also be used when light is incident from the reverse face side of the InP substrate 1.

Figure 2:
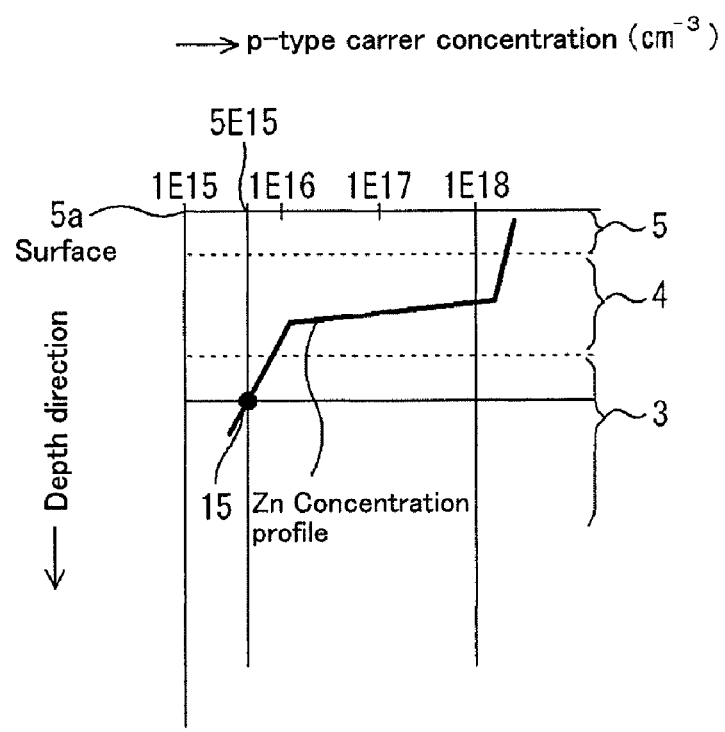
FIG. 2 is a graph showing a zinc (Zn) concentration distribution in the light-receiving element shown in FIG. 1.

In the absorption layer 3 having the multiquantum well structure, a p-n junction is formed at a position corresponding to a boundary front of the p-type region 6. By applying a reverse bias voltage between the p-side electrode 11 and the n-side electrode 12, a depletion layer is more widely formed at a side in which the n-type impurity concentration is low (n-type impurity background). The background in the absorption layer 3 having the multiquantum well structure is about $5\times10^{15}/cm^3$ or less in terms of the n-type impurity concentration (carrier concentration). A position of the pn-junction 15 is determined by the intersecting point of the background (n-type carrier concentration) of the absorption layer 3 having the multiquantum well structure and the concentration profile of Zn functioning as a p-type impurity. Specifically, the position of the pn-junction 15 is shown in FIG. 2.

In the layer 4 for adjusting the concentration distribution of the diffused impurity, the concentration of the p-type impurity that is selectively diffused from a surface 5a of the InP window layer 5 is drastically decreased from a high-concentration region at the InP window layer side to the absorption layer side. Consequently, in the absorption layer 3, an impurity concentration, i.e., the Zn concentration, of $5\times10^{16}/cm^3$ or less can be easily realized. In FIG. 2, about $1\times10^{16}/cm^3$ or less, which is lower than the above value, of the Zn concentration is realized in the absorption layer 3.

The light-receiving element 10 according to the present invention aims to have a light-receiving sensitivity in the near-infrared region and a longer-wavelength side thereof. Therefore, as the window layer 5, a material having a bandgap energy larger than the bandgap energy of the absorption layer 3 is preferably used. For this reason, InP, which has a bandgap energy larger than that of the absorption layer 3 and achieves a satisfactory lattice match, is generally used as the window layer 5. Alternatively, InAlAs, which has a bandgap energy substantially the same as that of InP, may be used.

Features of Light-Receiving Element Array of this Embodiment

Features of this embodiment lie in that the light-receiving element array includes the following factors.

1. When an impurity is introduced in a multiquantum well structure at a high concentration by selective diffusion, the structure may be broken. Therefore, it is necessary to suppress an impurity introduction by selective diffusion. In general, it is necessary to control the concentration of the p-type impurity introduced by diffusion to be $5\times10^{16}/cm^3$ or less.

2. In order to stably realize the above low concentration of the p-type impurity with good reproducibility in actual production, the InGaAs layer 4 for adjusting the concentration distribution of the diffused impurity is provided on the absorption layer 3. In this layer 4 for adjusting the concentration distribution of the diffused impurity, when an area of the layer 4 in the thickness direction at the absorption layer side has the above-mentioned low impurity concentration, the electrical conductivity of the area having the low impurity concentration decreases, or the electrical resistance thereof increases. If the electrical conductivity of the area having the low impurity concentration in the layer 4 decreases, responsiveness decreases, and, for example, a satisfactory moving image cannot be obtained. However, in the case where the layer for adjusting the concentration distribution of the diffused impurity is formed of a material having a bandgap energy smaller than the bandgap energy corresponding to that of InP, specifically, a Group III-V compound semiconductor material having a bandgap energy of less than 1.34 eV, even when the impurity concentration is low, the electrical conductivity is not significantly decreased. An example of the Group III-V compound semiconductor material that satisfies the requirement of the layer for adjusting the concentration distribution of the diffused impurity is InGaAs. The reason why the impurity concentration of the absorption layer is controlled to be $5\times10^{16}/cm^3$ or less will be described in more detail. For example, when the depth of selective diffusion of a p-type impurity (Zn) increases and thus the Zn concentration in the absorption layer 3 exceeds $1\times10^{17}/cm^3$, in a portion having such an excessively high concentration, atoms of InGaAs and GaAsSb constituting the quantum well layers are randomly mixed, thereby breaking a superlattice structure. The crystal quality of the broken portion degrades, thereby degrading element characteristics, for example, increasing a dark current. The Zn concentration is generally measured by secondary ion mass spectroscopy (SIMS). However, it is difficult to analyze concentrations on the order of $10^{17}$ $cm^{-3}$ or $10^{16}$ $cm^{-3}$, resulting in a relatively large measurement error. The above detailed description concerns a discussion about a Zn concentration with a double or half accuracy, and this is resulted from the roughness of this measurement accuracy. Accordingly, for example, discussing a difference between $5\times10^{16}/cm^3$ and $6\times10^{16}/cm^3$ is difficult in terms of the measurement accuracy and is not so significant.

By using a material having a small bandgap energy as the layer for adjusting the concentration distribution of the diffused impurity, an increase in the electrical resistance can be suppressed even at a low impurity concentration. It is believed that a response speed to an application of a reverse bias voltage etc. is determined by a CR time constant determined by a capacitance and the electrical resistance. Accordingly, the response speed can be increased by suppressing the increase in the electrical resistance R as described above.

3. In this embodiment, the multiquantum well structure has a type-II structure. In a type-I multiquantum well structure, in the case of a light-receiving element having a structure in which a semiconductor layer having a small bandgap energy is sandwiched between semiconductor layers having a large bandgap energy so as to have a light-receiving sensitivity in the near-infrared region, the upper limit of the wavelength (cut-off wavelength) of the light-receiving sensitivity is determined by the bandgap of the semiconductor layer having the small bandgap energy. That is, transition of electrons or holes caused by light is performed in the semiconductor layer having the small bandgap energy (direct transition). In this case, a material that extends the cut-off wavelength to a longer wavelength region is very limited among Group III-V compound semiconductors. In contrast, in the type-II multiquantum well structure, when two different types of semiconductor layers having a common Fermi energy are alternately laminated, a difference between an energy of the conduction band of a first semiconductor and an energy of the valence band of a second semiconductor determines the upper limit of the wavelength (cut-off wavelength) of the light-receiving sensitivity. That is, transition of electrons or holes caused by light is performed between the valence band of the second semiconductor and the conduction band of the first semiconductor (indirect transition). Therefore, by controlling the energy of the valence band of the second semiconductor to be higher than that of the valence band of the first semiconductor and controlling the energy of the conduction band of the first semiconductor to be lower than that of the conduction band of the second semiconductor, the light-receiving sensitivity can be easily extended to the long-wavelength side, as compared with the case of the direct transition performed in a single semiconductor.

4. As described above, a p-type impurity is introduced into the inside of the peripheral portion of a light-receiving element by diffusion so that the diffusion in the peripheral portion is two-dimensionally limited by performing selective diffusion using a selective diffusion mask pattern 36. Accordingly, the above-mentioned pn-junction 15 is not exposed on an end face of the light-receiving element. As a result, leakage of a photocurrent is suppressed.

Figure 3:
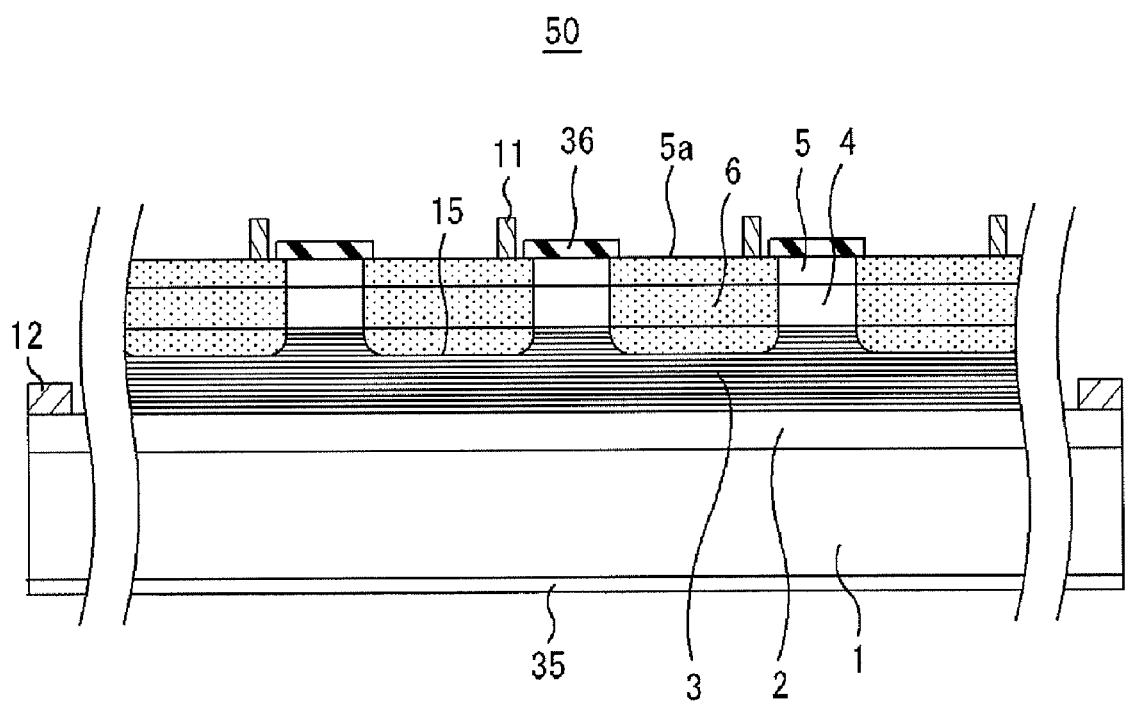
FIG. 3 is a cross-sectional view showing a light-receiving element array according to the first embodiment of the present invention.

FIG. 3 is a cross-sectional view showing a light-receiving element array 50 in which a plurality of the light-receiving elements 10 described above are arranged on an epitaxial wafer including a common InP substrate 1. A feature of this light-receiving element array 50 lies in that the plurality of light-receiving elements 10 are arranged without providing element isolation trenches. As described in item 4 above, the position of the p-type region 6 is limited inside each of the light-receiving elements, and adjacent light-receiving elements are reliably separated from each other. As in the light-receiving element 10 shown in FIG. 1, the absorption layer 3 is composed of a multiquantum well structure, the layer 4 for adjusting the concentration distribution of the diffused impurity is provided on the absorption layer 3, and the concentration of the p-type impurity in the absorption layer 3 is $5\times10^{16}/cm^3$ or less.

Next, a method of producing the light-receiving element 10 shown in FIG. 1 will be described. An InP buffer layer 2 or InGaAs buffer layer 2 having a thickness of 2 μm is deposited on an n-type InP substrate 1. Next, an absorption layer 3 having a multiquantum well structure composed of (InGaAs/GaAsSb) or (GaInNAs/GaAsSb) is formed. The thickness of the InGaAs layers (or the GaInNAs layers) or the GaAsSb layers constituting a unit of the quantum well structure is 5 nm, and the number of pairs (the number of repetitions of the unit quantum well) is 300. Next, an InGaAs layer having a thickness of 1 μm is epitaxially grown on the absorption layer 3 as a layer 4 for adjusting the concentration distribution of an impurity of Zn introduced by diffusion. Finally, an InP window layer 5 having a thickness of 1 μm is epitaxially grown. Preferably, each of the absorption layer 3 and the layer 4 for adjusting the concentration distribution of the diffused impurity is epitaxially grown by molecular beam epitaxy (MBE). The InP window layer 5 may also be epitaxially grown by MBE. Alternatively, after the layer 4 for adjusting the concentration distribution of the diffused impurity is grown, the resulting InP substrate 1 is taken out from an MBE apparatus, and the InP window layer 5 may then be epitaxially grown by metal organic vapor phase epitaxy (MOVPE).

The InP buffer layer 2 or the InGaAs buffer layer 2 may be undoped layer. Alternatively, the InP buffer layer 2 or the InGaAs buffer layer 2 may be doped with an n-type dopant, such as Si, of about $1\times10^{17}/cm^3$. Each of the absorption layer 3 having a multiquantum well structure composed of InGaAs/GaAsSb (or GaInNAs/GaAsSb), the InGaAs layer 4 for adjusting the concentration distribution of the diffused impurity, and the InP window layer 5 is preferably an undoped layer. Alternatively, these layers may be doped with a minute amount (for example, about $2\times10^{15}/cm^3$) of an n-type dopant such as Si. In addition, an n-side electrode-forming layer for forming an n-side electrode, the n-side electrode-forming layer being doped with an n-type dopant in a high concentration of about $1\times10^{18}/cm^3$ may be formed between the InP substrate 1 and the buffer layer 2. The InP substrate 1 may be a semi-insulating InP substrate doped with iron (Fe). In this case, the n-side electrode-forming layer doped with an n-type dopant of about $1\times10^{18}/cm^3$ is formed between the semi-insulating InP substrate 1 and the buffer layer 2.

An optical device is produced using the laminated structure (epitaxial wafer) including the InP substrate 1. An SiN selective diffusion mask pattern 36 is formed on a surface 5a of the InP window layer 5. Zinc (Zn) is selectively diffused from an opening of the mask pattern 36, thereby forming a p-type region 6 so as to reach the absorption layer 3 having the multiquantum well structure composed of InGaAs/GaAsSb (or GaInNAs/GaAsSb). A front end portion of the p-type region 6 forms a pn-junction 15. In this case, a high-concentration region in which the Zn concentration is about $1\times10^{18}/\text{cm}^3$ or more is limited in the InGaAs layer 4 for adjusting the concentration distribution of the diffused impurity. Specifically, the distribution of the high-concentration impurity is continuous in the thickness direction from the surface 5a of the InP window layer 5 to the inside of the InGaAs layer 4 for adjusting the concentration distribution of the diffused impurity, and is decreased to a concentration of $5\times10^{16}/\text{cm}^3$ or less at a deeper position of the layer 4 for adjusting the concentration distribution of the diffused impurity. In addition, the Zn concentration distribution near the pn-junction 15 shows a graded junction.

In a one-dimensional or two-dimensional array of the light-receiving elements 10, that is, the light-receiving element array shown in FIG. 3, adjacent light-receiving elements are separated by the selective diffusion of Zn (diffusion that is two-dimensionally limited so that a diffused portion is disposed inside a peripheral portion of the light-receiving element) without performing mesa-etching for element isolation. That is, the Zn selective diffusion region (p-type region) 6 constitutes a main portion of each of the light-receiving elements 10 to form a single pixel. A region where Zn is not diffused separates each pixel. Accordingly, the light-receiving elements do not suffer from, for example, a crystal damage caused by mesa-etching, and thus a dark current can be suppressed.

Japanese Unexamined Patent Application Publication No. 2003-344279 describes the following concern: In the case where a pn-junction is formed by selective diffusion of an impurity, since the impurity diffuses not only in the depth direction but also in the lateral direction (the direction orthogonal to the depth direction), the distance between elements cannot be decreased to a certain dimension or less. However, according to an experimental result of selective diffusion of Zn, it was confirmed that, in a structure in which an InP window layer 5 is disposed on the top surface and an InGaAs layer 4 for adjusting the concentration distribution of a diffused impurity is disposed under the window layer 5, the area of the diffusion in the lateral direction is substantially the same as or smaller than the area of the diffusion in the depth direction. That is, in selective diffusion of Zn, although the Zn diffuses in the lateral direction so that the diameter of a diffusion region is larger than the diameter of an opening of a mask pattern 36, the degree thereof is small and the area is only slightly expanded from the opening of the mask pattern 36, as schematically shown in, for example, FIGS. 1 and 3.

Figure 4:
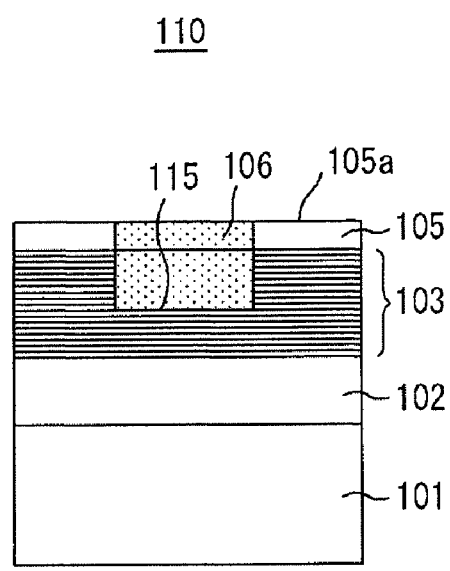
FIG. 4 is a cross-sectional view showing a light-receiving element of a first reference example different from the present invention.

FIG. 4 is a cross-sectional view showing a light-receiving element 110 of a first reference example different from the present invention. The light-receiving element 110 of the first reference example has the following laminated structure: (InP substrate 101, InP or InGaAs buffer layer 102, absorption layer 103 having a multiquantum well structure composed of (GaInNAs/GaAsSb), and InP window layer 105)

Figure 5:
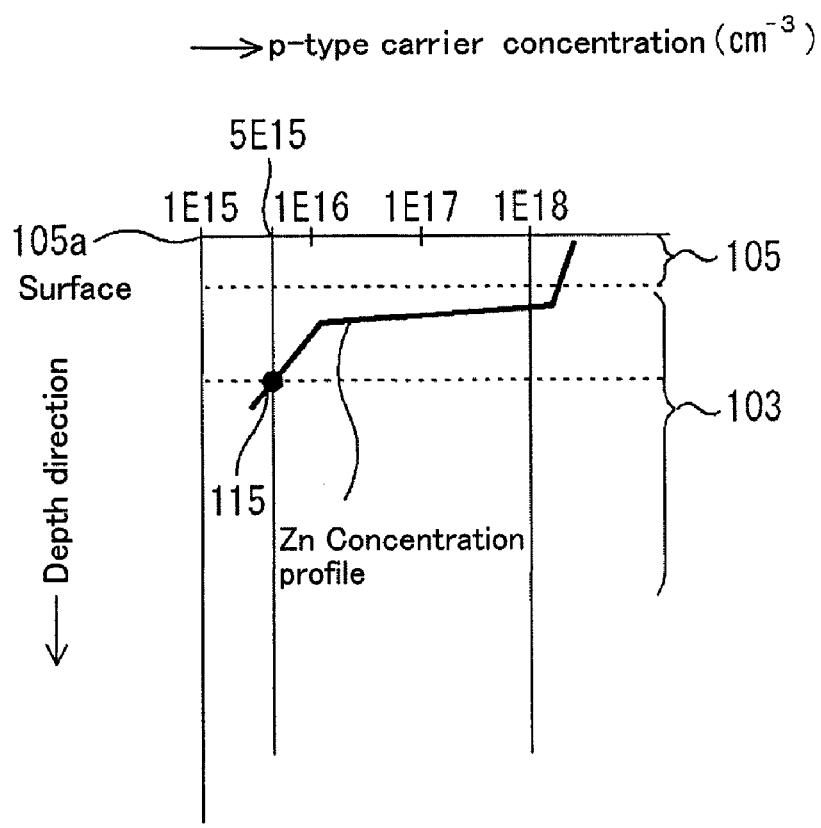
FIG. 5 is a graph showing a Zn concentration distribution in the light-receiving element shown in FIG. 4.

This laminated structure differs from the laminated structure of an embodiment of the present invention in that the layer for adjusting the concentration distribution of a diffused impurity is not provided. Specifically, the absorption layer 103 having the multiquantum well structure is disposed directly under the InP window layer 5. When the layer for adjusting the concentration distribution of a diffused impurity is not provided, as shown in FIG. 5, for example, the Zn concentration distribution shows a high concentration up to the absorption layer 103 having the multiquantum well structure. That is, a region having a high impurity concentration of $1\times10^{18}/\text{cm}^3$, which exceeds $5\times10^{16}/\text{cm}^3$, is formed in the multiquantum well structure. When an impurity is introduced into a multiquantum well structure at a high concentration, the structure is broken, thereby significantly increasing a dark current. In order to prevent such a high-concentration impurity region from forming in the multiquantum well structure, the layer for adjusting the concentration distribution of the diffused impurity is formed, and selective diffusion is then performed.

However, there is a room for realizing the following ideas regarding selective diffusion of Zn: (1) The time required for introduction by diffusion is limited to be short so that a high-concentration region does not reach the multiquantum well structure of the absorption layer 103. (2) The thickness of the InP window layer 105 is increased so that the InP window layer 105 has the function of the layer for adjusting the concentration distribution of a diffused impurity.

Figure 6:
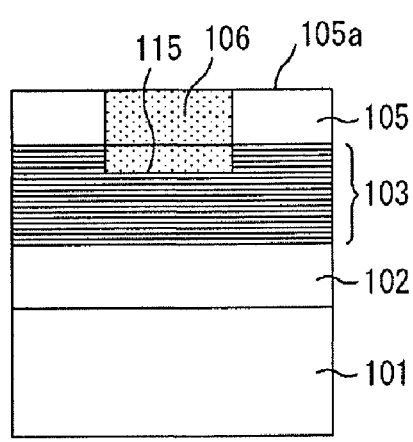
FIG. 6 is a cross-sectional view showing a light-receiving element of a second reference example different from the present invention.
Figure 7:
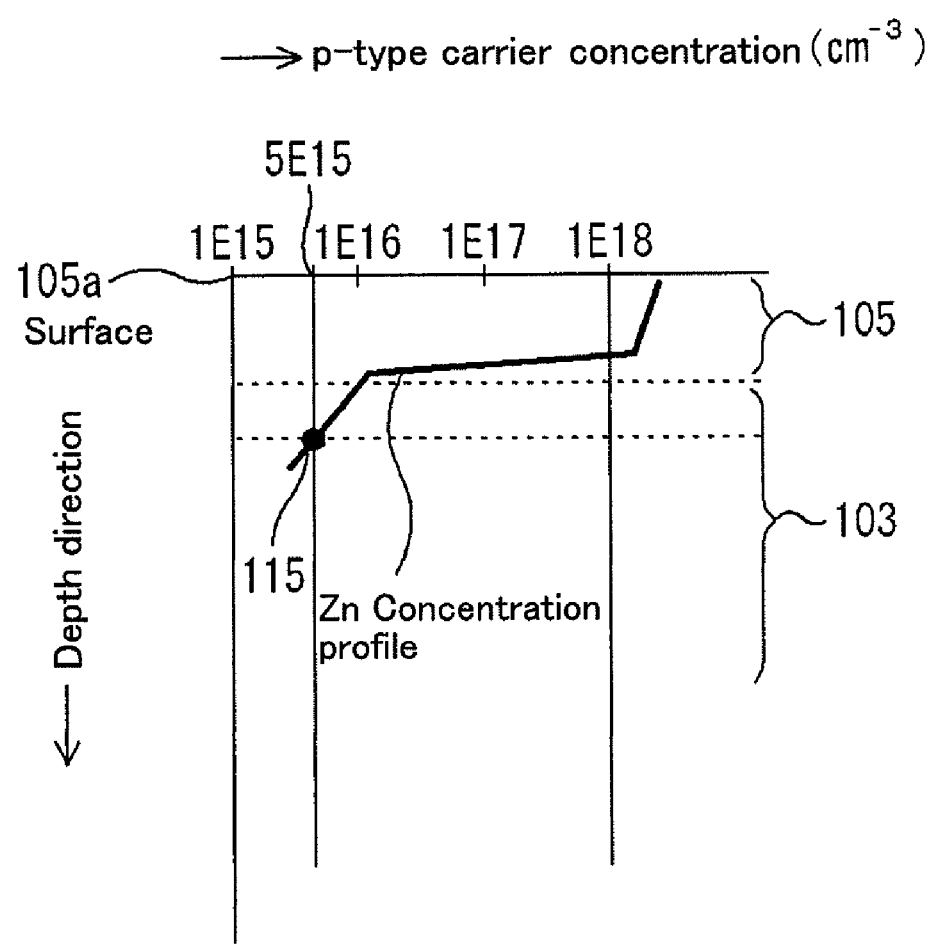
FIG. 7 is a graph showing a Zn concentration distribution in the light-receiving element shown in FIG. 6.

FIG. 6 is a cross-sectional view showing a light-receiving element 110 of a second reference example for examining the cases described in (1) and (2) above. The light-receiving element 110 of the second reference example has substantially the same laminated structure as the light-receiving element of the first reference example, but the thickness of the InP window layer 105 of the second reference example is larger than that of the first reference example. This light-receiving element 110 corresponds to the above case (2), and can also be used for examining the above case (1). FIG. 7 shows a Zn concentration distribution obtained when selective diffusion was performed in the laminated structure shown in FIG. 6 so as not to form a high-concentration region of Zn in the multiquantum well structure of the absorption layer 103. In the case of the Zn concentration distribution shown in FIG. 7, the Zn concentration is drastically decreased from a high concentration to a low concentration in the InP window layer 105, and a low-concentration impurity region of about $1\times10^{16}/\text{cm}^3$ is formed in the InP window layer 105 at the side adjacent to the absorption layer.

When the low-concentration impurity region of about $1\times10^{16}/\text{cm}^3$ is formed in the InP window layer 105, the electrical resistance in the region is increased, thereby decreasing a response speed, as repeatedly described above. For this reason, the function of the layer for adjusting the concentration distribution of a diffused impurity cannot be provided to a material having a bandgap energy that is large enough to form the window layer, more specifically, to the InP window layer 105 which is a typical material thereof. This also applies to both the case (1) and case (2) above. Accordingly, a material having a bandgap energy corresponding to that of InP or less, more specifically, a material satisfying a bandgap energy of less than 1.34 eV is preferably used as the layer for adjusting the concentration distribution of a diffused impurity. That is, it is necessary to use a material such as InGaAs, in which a decrease in the electrical conductivity is relatively small and an increase in the electrical resistance is relatively small even in a low-concentration impurity region.

Second Embodiment

Image Display (Imaging) of Moisture Distribution

Figure 8:
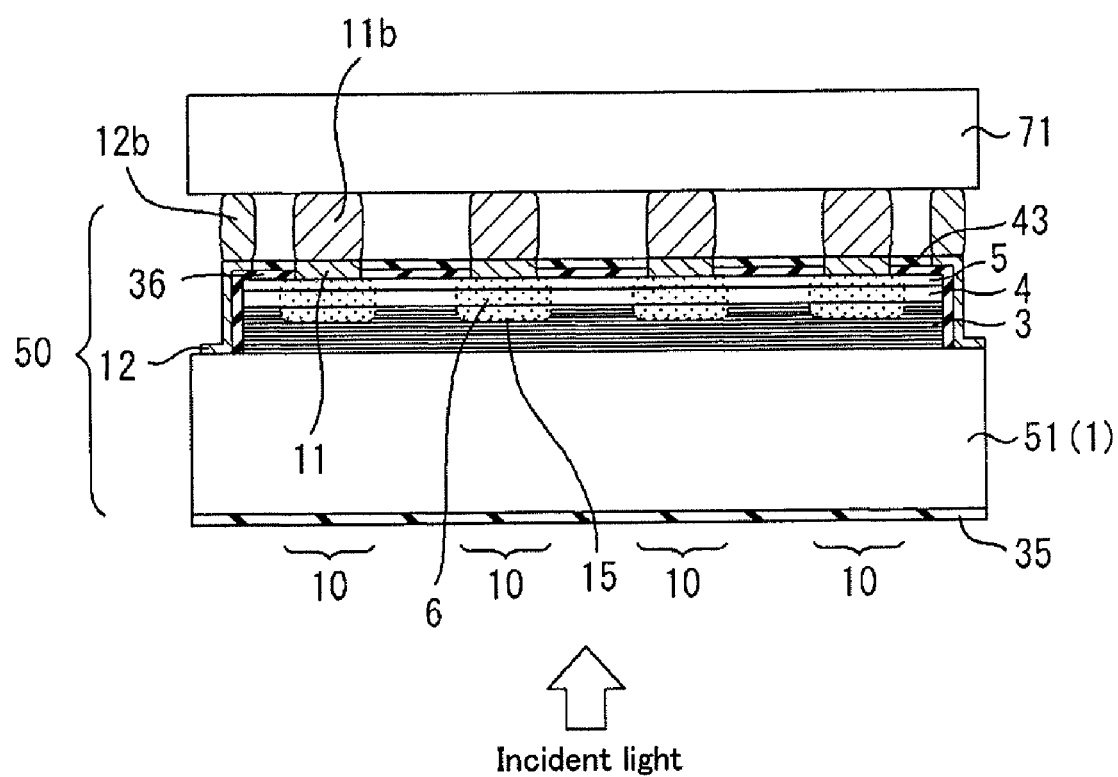
FIG. 8 is a view showing the outline of an imaging device according to a second embodiment of the present invention.
Figure 9:
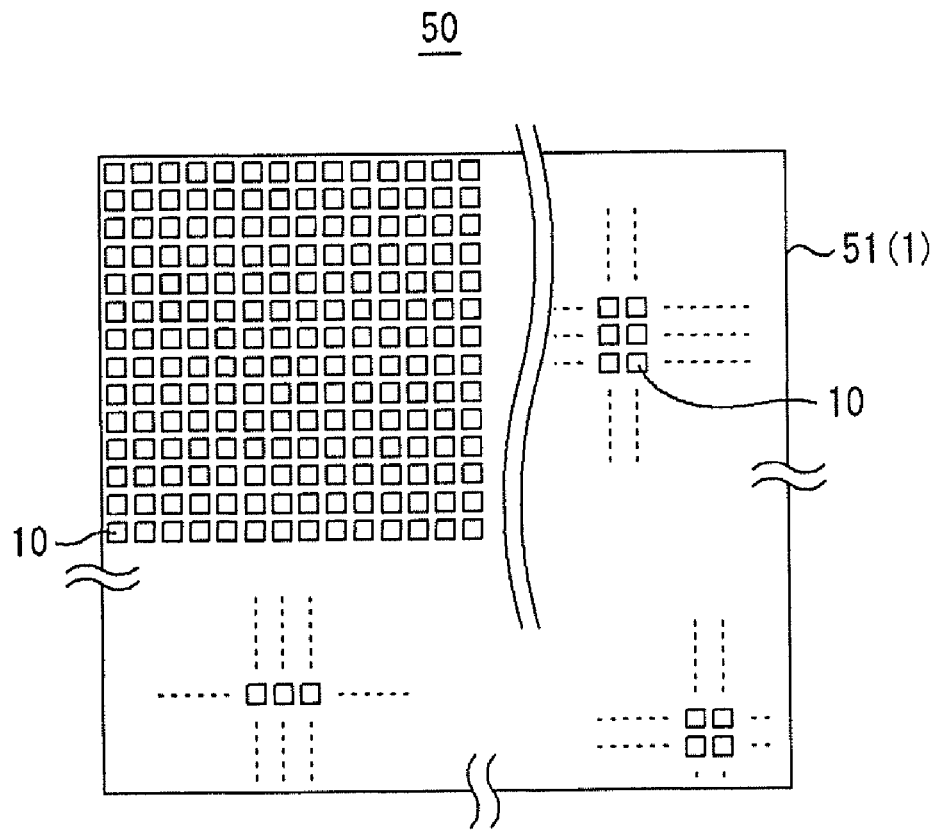
FIG. 9 is a view showing a light-receiving element array of the imaging device shown in FIG. 8.
Figure 10:
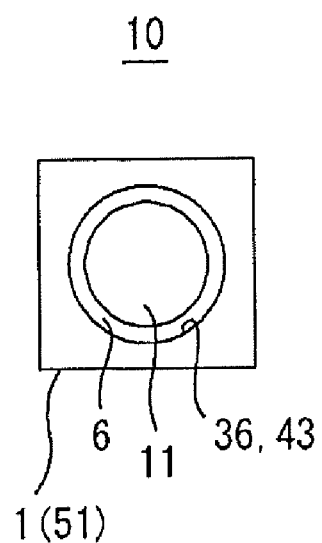
FIG. 10 is a view showing a light-receiving element in the light-receiving element array shown in FIG. 9.

1. The Structure of an Imaging Device (Moisture Distribution Imaging Device) in a Moisture Detector FIG. 8 is a view showing the outline of an imaging device (light-receiving element array) 70 included in a moisture detector according to a second embodiment of the present invention. Optical components such as a lens are omitted. FIG. 9 is a view illustrating the light-receiving element array 50 of the imaging device. FIG. 10 is a view showing a light-receiving element 10 in the light-receiving element array 50 shown in FIG. 9. In FIG. 8, in an imaging device 70, light-receiving elements 10 provided on a common InP substrate 51 are epi-side-down mounted so that an epitaxial layer side of the light-receiving elements 10 face a multiplexer 71 having a function of a mounting substrate. A p-side electrode 11 that is electrically connected to a p-type region 6 of the epitaxial layer of each of the light-receiving elements 10 and an n-side electrode 12 provided on the common n-type InP substrate 51 (1) are connected to the multiplexer 71 and send electrical signals to the multiplexer 71. The multiplexer 71 receives the electrical signals from each of the light-receiving elements 10 and performs a process for forming a whole image of an object. The n-side electrode 12 and the p-side electrode 11 are electrically connected to the multiplexer 71 via solder bumps 12b and 11b, respectively. Incident light enters through an antireflection film 35 provided on the reverse face of the InP substrate 51 and received in a pn-junction 15 which is an interface between the p-type region 6 and an absorption layer 3. The p-type region 6 is introduced from an opening portion of a Zn-selective diffusion mask pattern 36 that is made of SiN and that also functions as a protective film. The Zn-selective diffusion mask pattern 36 is left as it is together with a SiON film pattern 43 provided on the mask pattern 36 and functioning as a protective film. The structure of the light-receiving element array 50 and the structure of each of the light-receiving elements will now be described in detail with reference to FIGS. 9 and 10, respectively.

In FIG. 9, light-receiving elements 10 of a light-receiving element array 50 are provided on a common InP substrate 51 (1). Current signals generated by receiving cosmic light of an SWIR band in each of the light-receiving elements 10 are sent to a multiplexer 71, which also functions as a mounting substrate, and undergo a process for forming an image, as described above. The number of pixels is changed by changing the size and the pitch of each of the light-receiving elements and the size of the array. The light-receiving element array 50 shown in FIG. 9 has 90,000 pixels. The light-receiving element 10 shown in FIG. 10 includes a plurality of epitaxial films formed on an InP substrate 1 and also includes a selective diffusion mask pattern 36 for introducing a p-type impurity, the mask pattern 36 being used in forming a p-type region 6. A p-side electrode 11 is connected to the p-type region 6. The p-side electrode 11 is connected to, for example, wiring of a mounting substrate such as the multiplexer 71 via a solder bump or the like.

Figure 11:
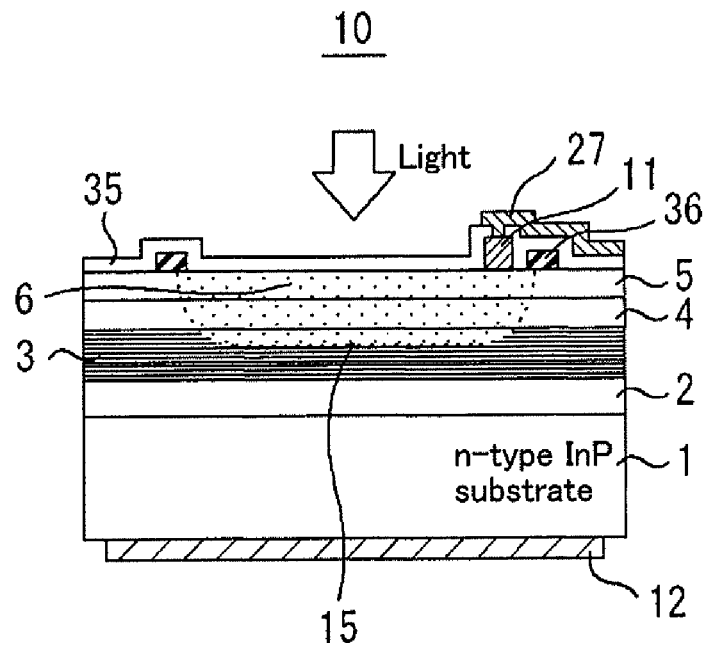
FIG. 11 is a cross-sectional view showing a light-receiving element that is epi-side-up mounted.

FIG. 11 is a cross-sectional view illustrating a light-receiving element 10 that is epi-side-up mounted, which is different from the epi-side down light-receiving element 10 shown in FIG. 8. In the present invention, the light-receiving element in the imaging device may be epi-side-down mounted or epi-side-up mounted. In this light-receiving element 10, from the bottom, an n-type InP buffer layer 2, an absorption layer 3, a layer 4 for adjusting the concentration distribution of a diffused impurity, an InP window layer 5, a selective diffusion mask pattern 36, and an antireflection film 35 are disposed on an n-type InP substrate 1. A p-type region 6 is formed so as to extend from the InP window layer 5 to a pn-junction 15 in the absorption layer 3 through the layer 4 for adjusting the concentration distribution of the diffused impurity. In addition, an n-side electrode 12 is disposed on the reverse face of the n-type InP substrate 1. A p-side electrode 11 is disposed on the surface 5a of the InP window layer 5 of the p-type region 6 and is electrically connected to a wiring electrode 27. In this embodiment, the absorption layer 3 receives light having a wavelength in the range of 1.0 to 3.0 μm. Specifically, the absorption layer 3 is composed of the above-described type-II multiquantum well structure.

Figure 12:
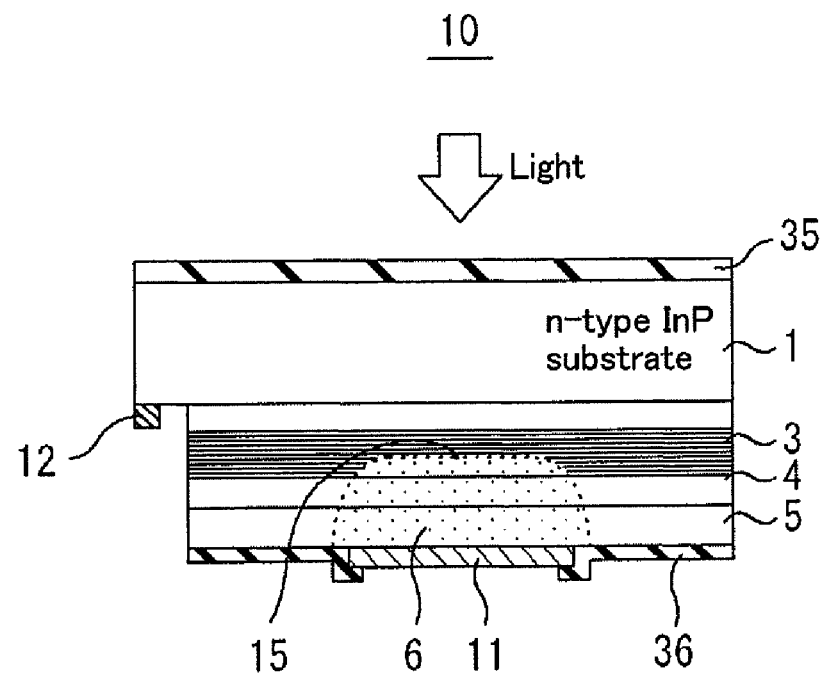
FIG. 12 is a cross-sectional view showing a light-receiving element that is epi-side-down (flip-chip) mounted.

The light-receiving element 10 shown in FIG. 11 is epi-side-up mounted as described above. Light is incident from the epitaxial layer side, i.e., the InP window layer 5 side. The light-receiving element of this embodiment may be epi-side-up mounted or epi-side-down mounted as describe above. As shown in FIG. 12, the light-receiving element 10 may be epi-side-down mounted, and light may be incident from the reverse face side of the InP substrate 1. In the case of the epi-side-down mounted light-receiving element 10 shown in FIG. 12, an antireflection film 35 is provided on the reverse face of the InP substrate 1. A layer 4 for adjusting the concentration distribution of a diffused impurity, an InP window layer 5, a p-side electrode 11, and a SiN selective diffusion mask pattern 36 that also functions as a protective film are provided as in the case of the epi-side-up mounting. In the epi-side-down mounting shown in FIG. 12, InP constituting the InP substrate and other components is transparent to light in the SWIR band. Accordingly, the light in the SWIR band reaches a pn-junction 15 of an absorption layer 3 without being absorbed. Also in the structure shown in FIG. 12, the absorption layer 3 is composed of the above-described type-II multiquantum well structure. This also applies to embodiments of the present invention described below unless otherwise stated.

As shown in FIG. 11, the p-side electrode 11 and the n-side electrode 12 may be disposed at positions facing each other with the InP substrate 1 therebetween. Alternatively, as shown in FIG. 12, the p-side electrode 11 and the n-side electrode 12 may be disposed at positions of the same side of the InP substrate 1. In the structure shown in FIG. 12, each of the light-receiving elements 10 of the light-receiving element array 50 shown in FIG. 9 is electrically connected to an integrated circuit by a flip-chip mounting. In the light-receiving elements having the structures shown in FIGS. 11 and 12, light incident on the pn-junction 15 is absorbed to generate current signals. Each of the current signals is converted to an image of a pixel through the integrated circuit, as described above.

The InP substrate 1 is preferably an off-angle substrate which is tilted from (100) in the [111] direction or the [11-1] direction by 5 to 20 degrees. More preferably, the substrate is tilted from (100) in the [111] direction or the [11-1] direction by 10 to 15 degrees. By using such a substrate having a large off-angle, an n-type InP buffer layer 2, an absorption layer 3 having a type-II quantum well structure, an InGaAs layer 4 for adjusting the concentration distribution of a diffused impurity, and an InP window layer 5, all of which have a low defect density and good crystallinity, can be produced. As a result, an absorption layer in which a dark current is suppressed can be obtained. Accordingly, an absorption layer capable of markedly improving the performance of a device that receives faint cosmic light in the SWIR band to capture an image can be obtained. That is, the operation of the light-receiving element including the above off-angle substrate is particularly useful for improving the quality of an imaging device that receives cosmic light to capture an image.

The above-mentioned large off-angle of an InP substrate has not been proposed to date, and the above advantage due to the use of such an InP substrate has been confirmed by the inventors of the present invention. The large off-angle of an InP substrate is an important factor in the case where an epitaxial film having satisfactory crystallinity is grown on the InP substrate. For example, in an absorption layer 3 that has the above-described quantum well structure and that is supposed to be able to emit and receive light in a very long-wavelength range, a nitrogen (N)-containing compound semiconductor, such as GaInNAs, may be contained. In reality, in such a case, the absorption layer 3 cannot be formed as a satisfactory epitaxial layer that can withstand practical use unless an InP substrate having the above large off-angle is used. That is, a nitrogen-containing compound semiconductor such as GaInNAs cannot be formed into an absorption layer in which a dark current is suppressed and dark points are reduced unless such an InP substrate having the above large off-angle is used. Consequently, it is impossible to obtain a sharp image using faint cosmic light in the SWIR band. Not only GaInNAs cited as an example above, but also GaInNAsP and GaInNAsSb are common in that the above range of a large off-angle of the InP substrate is necessary in order to obtain satisfactory crystallinity.

Each of the light-receiving elements 10 shown in FIGS. 11 and 12 includes the InGaAs layer 4 for adjusting the concentration distribution of a diffused impurity disposed so as to cover the absorption layer 3 and the InP window layer 5. Since a lattice constant of the absorption layer 3 is the same as that of the InP substrate 1, the InGaAs layer 4 for adjusting the concentration distribution of the diffused impurity which can reliably decrease a dark current and the InP window layer 5 can be formed on the absorption layer 3. Consequently, a dark current can be suppressed to improve the element reliability.

2. Natural Product Moisture Detector (Moisture Distribution Imaging Device)

(1) Third Embodiment

Moisture Distribution Imaging Device for Melon Skin

For net melons having a striped pattern (net) on the skin, such as muskmelons, Yubari melons, and Andes melons, the appearance of the melons is evaluated before shipment. Hitherto, an image of a melon has been captured with a color camera, and the appearance has been evaluated by discriminating a net portion of the skin from a base portion thereof on the basis of color information of the color image. This evaluation method is disadvantageous in that the result is readily affected by a difference in color due to individual difference, or unevenness of illumination, and thus discrimination accuracy is low. Consequently, a difference in the moisture content between the base portion and a net portion of the skin of a melon has been paid attention, and a discrimination method using near-infrared light has been proposed. This method utilizes a fact that the moisture content of a base portion of the skin of a melon is high, and the moisture content of a net portion thereof is low.

Figure 13:
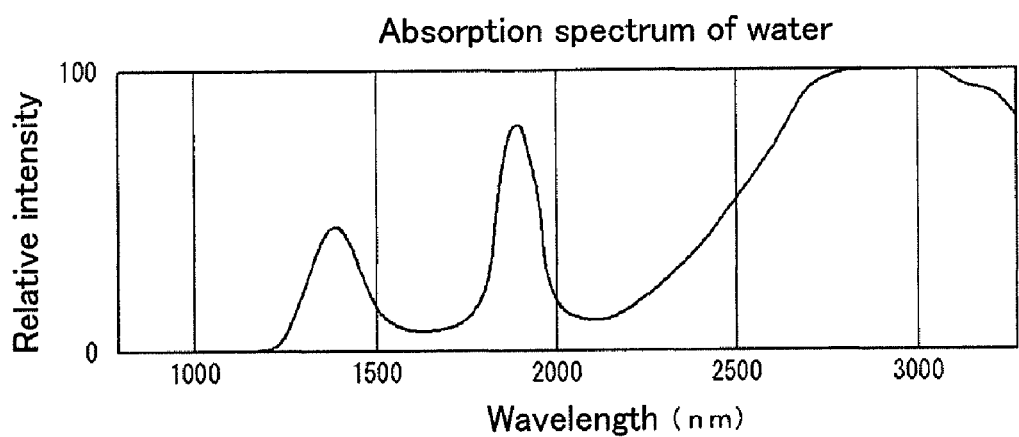
FIG. 13 is a graph showing an absorption spectrum of water.
Figure 14:
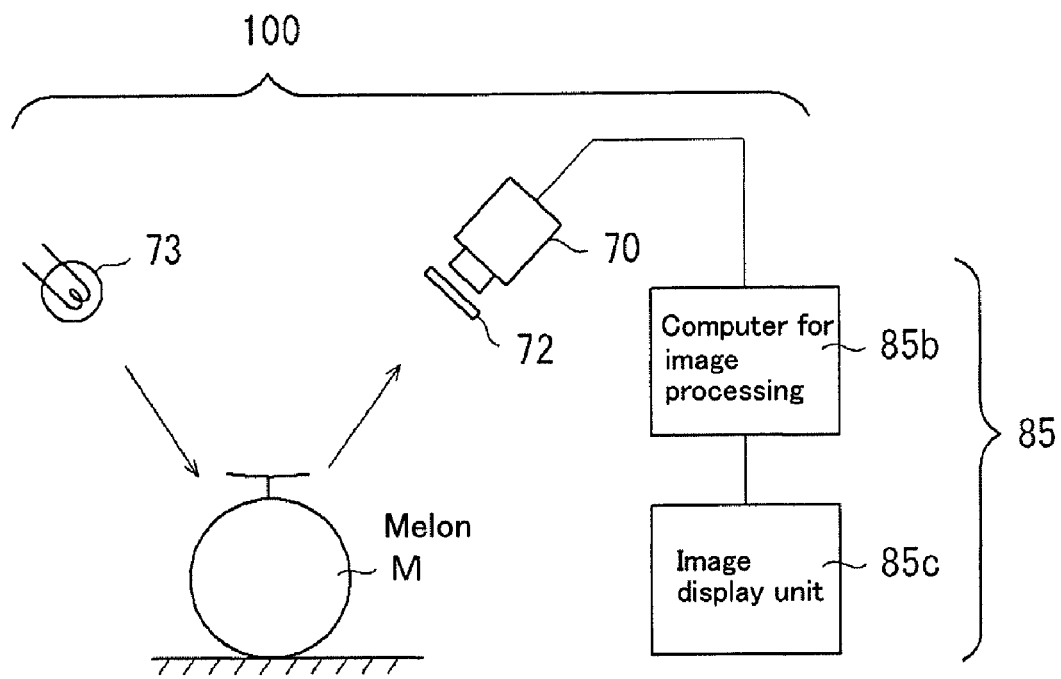
FIG. 14 is a view showing a natural product moisture detector (moisture distribution imaging device) according to a third embodiment of the present invention.

FIG. 13 is a graph showing an absorption spectrum of water. Referring to FIG. 13, the spectrum has absorption peaks at wavelengths of about 1.4 μm and about 1.9 μm. In addition, the spectrum has a large absorption at a wavelength of 2.5 μm, though the wavelength is not a peak wavelength. The net and the base can be discriminated with a high accuracy with the imaging device 70 shown in FIG. 8 using light components having these two peak wavelengths and a light component having a wavelength of 2.5 μm. FIG. 14 is a view showing a natural product moisture detector (device configured to form a moisture distribution image of a melon skin) 100 according to a third embodiment of the present invention.

Here, moisture distribution of a melon skin is detected. A light source 73 that emits light containing near-infrared light is placed, and a melon M is irradiated with the light. A filter 72 that transmits only a light component having a wavelength of about 1.4 μm, about 1.9 μm, or about 2.5 μm is disposed in front of an imaging device 70 that receives light reflected from the melon M. Image data captured by the imaging device 70 is processed in an operation unit 85b included in a control unit 85, and an image is displayed on a display unit 85c.

Figure 15:
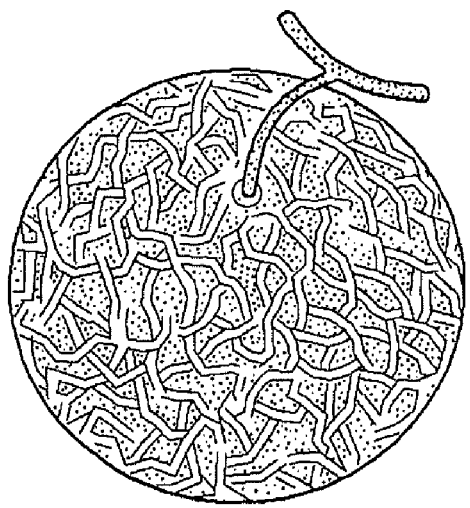
FIG. 15 is a view showing a moisture distribution image of a melon.

The moisture content in a base portion of the melon M is high, and thus the light component having a wavelength of about 1.4 μm or 1.9 μm is readily absorbed by the base portion compared with a dry net portion. Accordingly, the reflected light becomes weak. Therefore, as shown in FIG. 15, in a moisture distribution image of the melon M, net portions are brightly displayed, and base portions are darkly displayed. In addition to the net portions and the base portions, a portion of a vine and a cracked portion, which are targets of the evaluation, can also be sharply discriminated. This is because a dark current of the imaging device 70 shown in FIG. 8 and the light-receiving element 10 shown in FIG. 1 is low, and the intensities of light components having wavelengths of 1.4 μm and 1.9 μm can be sensitively detected. The discrimination of the base, the net, the vine, and the crack can be clearly performed even if there is a difference in color due to individual difference.

A light-receiving portion of the moisture detector 100 of the present invention detects the light component having a wavelength of about 1.4 μm, the light component having a wavelength of about 1.9 μm, and the light component having a wavelength of about 2.5 μm with a high sensitivity at a high S/N ratio. Accordingly, images in the light components having the above three types of wavelengths are obtained, and the images may be compared with each other and appropriately selected. In addition, an image having a high validity may be obtained by a statistical process. The above-described method of evaluating the appearance of a melon skin is a method that can be readily adapted to human perception. Evaluation can be readily accurately performed by a human using this method, as compared with, for example, a method in which a melon skin is scanned to obtain a variation in the moisture content in the form of one-dimensional data. A sharp image with a low dark current has not been obtained in the near-infrared region to date, and therefore the above-described image of moisture distribution could not be obtained. However, a sharp image with a high S/N ratio can be obtained by using the above-described light-receiving element array, and the formation of a sharp image of moisture distribution described in this embodiment can be realized.

(2) Fourth Embodiment

Measurement of Unhusked Rice Mixing Ratio with Moisture Detector

It is important to know an unhusked rice mixing ratio with a high accuracy in husked rice (mixed rice) obtained by husking unhusked rice with a husking roll and then winnowing the resulting rice, brown rice obtained by separating with a shaking separator, brown rice taken from a brown rice elevator, and the like. Hitherto, the unhusked rice mixing ratio has been measured by discriminating unhusked rice from brown rice on the basis of a difference in color of the surfaces of grains measured with an optical sensor. However, unhusked rice does not contain moisture in its hull, and brown rice, which is obtained by husking unhusked rice, contains a large amount of moisture on the surface thereof compared with the hull.

Figure 16:
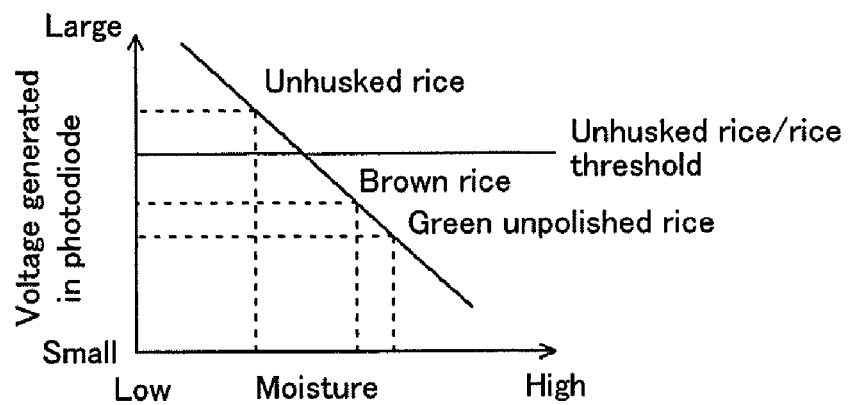
FIG. 16 is a graph illustrating a natural product moisture detector (unhusked rice mixing ratio measurement device) according to a fourth embodiment of the present invention.

Therefore, when a grain of unhusked rice and a grain of brown rice are irradiated with light having a wavelength of, for example, 1.45 µm and the reflected light is received by a photodiode (PD), a difference in a generated voltage is observed as shown in FIG. 16. Specifically, a reflected image of the unhusked rice is bright, and a reflected image of the brown rice is dark. Consequently, a threshold is determined between a voltage generated in the PD for the unhusked rice and a voltage generated in the PD for the brown rice, and a binary judging is performed, thereby clearly discriminating unhusked rice from brown rice. Even in green unpolished rice, the moisture content of the hull is significantly different from the moisture content of the inside of the rice. Accordingly, unlike the method using an optical sensor, this method does not cause a discrimination error. This also applies to colored rice.

Figure 17:
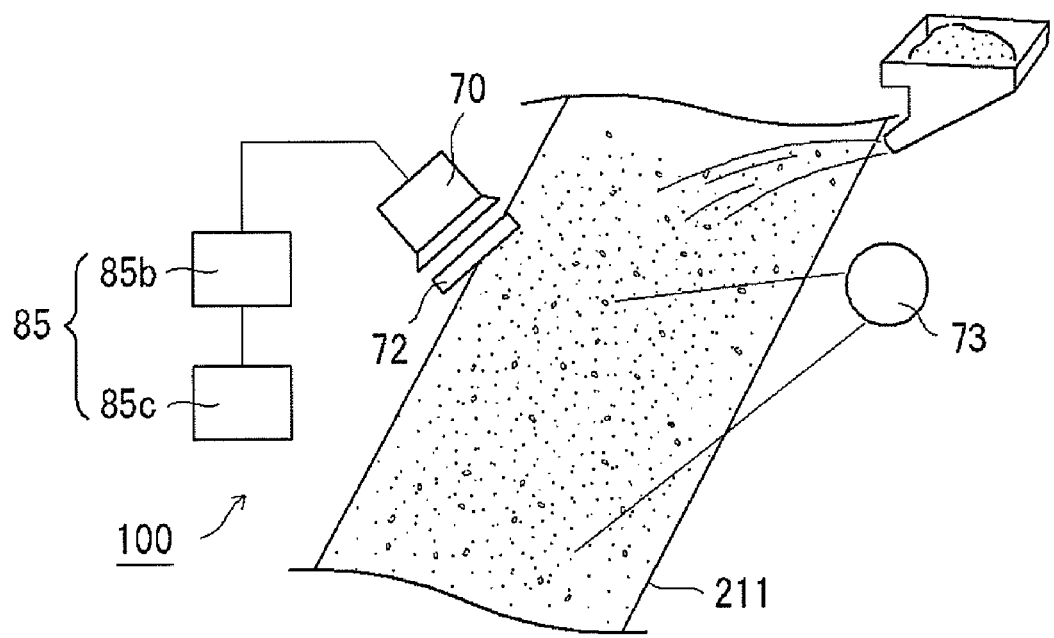
FIG. 17 is a view showing the unhusked rice mixing ratio measurement device according to the fourth embodiment of the present invention.

FIG. 17 is a view showing a natural product moisture detector 100 according to a fourth embodiment of the present invention. As shown in FIG. 17, grains distributed on a surface of a shaking separation plate 211 are irradiated with light emitted from a light source 73 and having a wavelength in the range of 1.4 to 2.5 µm. A supercontinuum light source (SC light source) or a light-emitting diode (LED) is preferably used as the light source. In the case of a halogen lamp, which is usually used as a light source, a large amount of heat is generated. As a result, brown rice irradiated with the halogen lamp is dried, and thus discrimination accuracy may be degraded. The moisture detector 100 including the imaging device 70 forms a moisture distribution image with an operation unit 85b of a control unit 85 on the basis of light reflected from the grains through a filter 72, and displays the image on a display unit 85c. In the moisture distribution image of the grains on the shaking separation plate 211, the image of unhusked rice is bright and the images of brown rice and green unpolished rice are dark. This contrast is emphasized because a threshold is determined. Therefore, the operation unit 85b of the control unit 85 can easily operate an area occupancy ratio and the like, and rapidly determine the unhusked rice mixing ratio of the grains on the shaking separation plate by a statistical process of the images. In addition, as for the wavelength used, any wavelength in the absorption spectrum of water shown in FIG. 13 may be used. For example, a light component having a wavelength of about 1.4 µm and a light component having a wavelength of about 1.9 µm can be used.

Hitherto, a dark current has been high in the near-infrared region, and thus a sharp image has not been obtained. Therefore, the above-described image of moisture distribution could not be obtained. However, a sharp image with a high S/N ratio can be obtained by using the above-described light-receiving element array, and the formation of a sharp image of moisture distribution described in this embodiment can be realized. In the above embodiments, a melon and rice are cited as a natural product. However, the light-receiving element array can be used for other fruits, cereals, marine algae, dried layer seaweed, sea foods, dairy products, and the like.

3. Biological Body Moisture Detector

In this embodiment, a description will be made of the usefulness of a biological body moisture detector or a moisture distribution imaging device according to the present invention for detecting moisture distribution in a biological body, in particular, in an eye, which is sensitive to light, though this detection is performed not for solving a specific problem.

(1) Fifth Embodiment

Ocular Moisture Distribution Image

Figure 18:
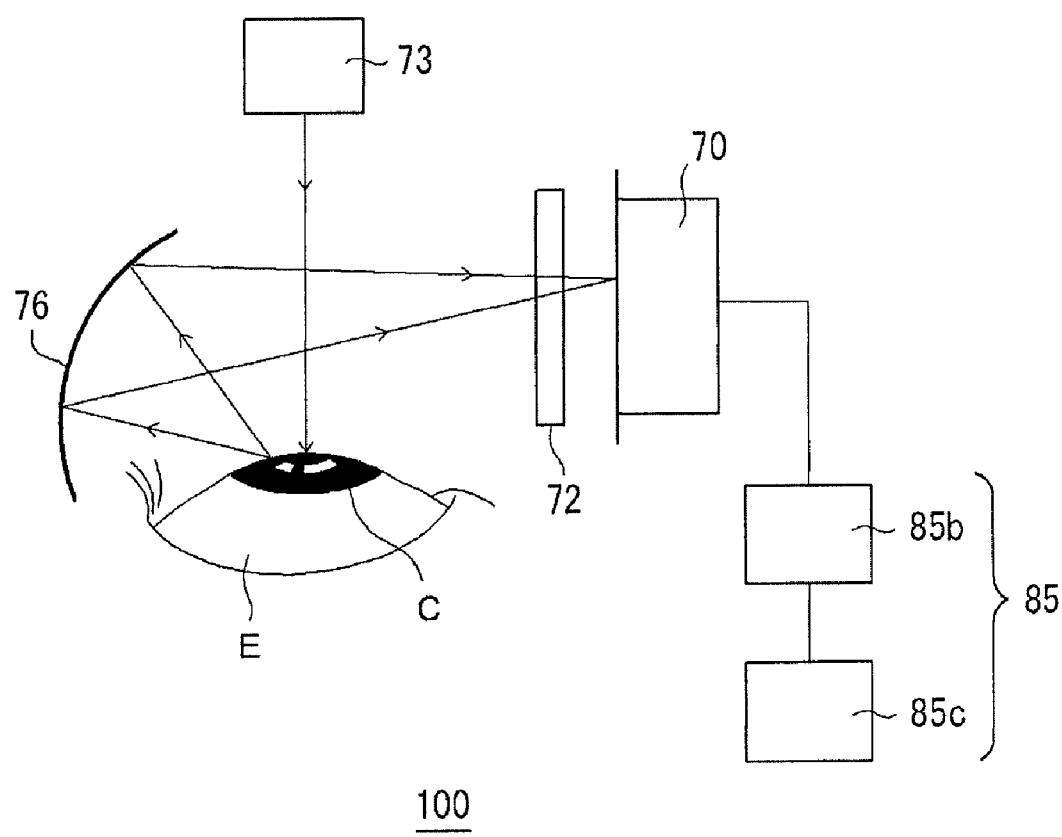
FIG. 18 is a view showing a biological body moisture detector (ocular moisture distribution imaging device) according to a fifth embodiment of the present invention.

FIG. 18 is a view showing a biological body moisture detector (ocular moisture distribution imaging device) 100 according to a fifth embodiment of the present invention. Ocular problems include many symptoms related to moisture, for example, dry eye and runny eye. When such a symptom occurs, the symptom can be evaluated by capturing a moisture distribution image of not only a horny coat C but also the entire front face of an eye E, as shown in FIG. 18. For example, a phenomenon in which the moisture concentration is unusually high at a position corresponding to a lacrimal gland can be detected. A concave mirror having a high reflectivity to near-infrared light is preferably used as a concave mirror 76. For example, a concave mirror made of gold (Au) is used. The concave mirror 76 is disposed not in front of the eye E but beside the eye E so as to reflect light from each portion of the eye E and to form an image of the portion of the eye E on an imaging device 70. A filter that transmits a light component having a wavelength of about 1.4 µm or a light component having a wavelength of about 1.9 µm is preferably used as a filter 72. A microcomputer 85b of a control unit 85 forms a moisture distribution image of the eye E on the basis of output signals of pixels of the imaging device 70 and display the image on a display unit 85c. The imaging device 70 shown in FIG. 8 is preferably used as the imaging device 70 according to the present invention. Since a dark current of the imaging device 70 is low and the imaging device 70 has a high sensitivity to a long-wavelength side, a sharp moisture distribution image having a high S/N ratio can be obtained. Therefore, the moisture distribution image is useful for understanding the operation of water in the eye, the movement of water, and the like.

Figure 19:
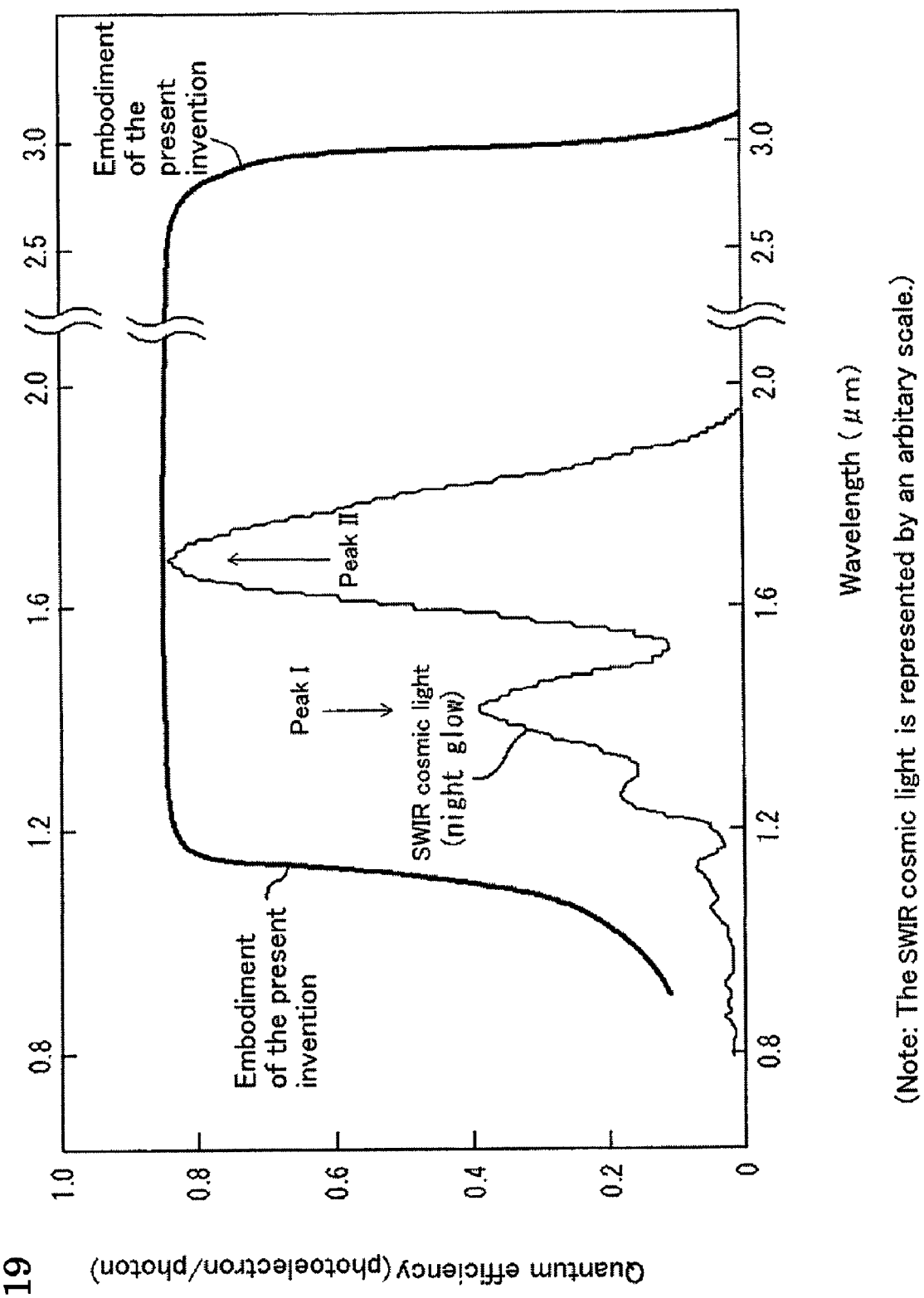
FIG. 19 is a graph showing SWIR cosmic light spectrum and a sensitivity distribution of a light-receiving element according to an embodiment of the present invention.

Since eyes very sensitively response to light, it is preferable that a light source 73 be not used. FIG. 19 is a graph showing an intensity distribution of SWIR cosmic light. For example, a peak I of this SWIR cosmic light spectrum can be used as a light source. The wavelength of the peak I lies at about 1.4 µm, which belongs to the absorption band of water. Accordingly, the light source 73 is removed in FIG. 18 and the SWIR cosmic light can be alternatively used. Alternatively, if an artificial light source 73 is used, the light may be limited to the near-infrared region and the peak value of the light may be, for example, double the peak intensity of the SWIR cosmic light. By using the SWIR cosmic light as a light source, eye-safe can be reliably realized. The reason why the SWIR cosmic light can be used or a light source having a low intensity level can be used is that the dark current of the imaging device 70 of the present invention can be reduced. That is, the reason is that a sharp image can be formed even by a weak signal.

(2) Sixth Embodiment

Detection of Horny Coat Moisture Distribution in Keratomileusis (Horny Coat Correction Operation)

It is known that a horny coat is evaporated using an ArF excimer laser to perform precise keratomileusis (laser in situ keratomileusis). Such keratomileusis is advantageous in that, for example, controllability of the amount of correction is good, the operation is automated, the stability is good, contagious side effects after the operation are small, and a decrease in the strength of the horny coat is small. In the keratomileusis, the clinical test results regarding slight nearsightedness and medium nearsightedness are effective. However, when the number of times laser irradiation is performed on a central part of a horny coat by an ArF excimer laser is increased, bleeding of a biological fluid onto a surface of the horny coat significantly occurs, and evaporation of the horny coat does not proceed. Accordingly, an intended amount of correction cannot be achieved for strong nearsightedness, resulting in a problem of the success rate of the operation being decreased. Furthermore, in irradiation of an ArF excimer laser on a horny coat, when nitrogen gas is sprayed in order to remove mushroom-shaped atomization generated from the surface of the horny coat during its evaporation, the surface is dried, thereby degrading smoothing of the evaporation surface.

As described above, a wet state of the surface of a horny coat during the operation is an important factor that has an influence on the success or failure of the evaporation, and thus it is necessary to monitor the wet state of the surface of the horny coat during the operation. In evaporation of a horny coat by an ArF excimer laser irradiation, collagen mainly absorbs the laser and evaporates, and a tissue fluid, which accounts for about 80% of the horny coat, is bled from the remaining horny coat. The composition of the portion after bleeding is changed, and the absorption of the ArF excimer laser is changed. The ArF excimer laser used in the evaporation of the collagen is converted to vibration and rotation of molecules of the collagen to increase the temperature. Consequently, infrared light having an intensity in proportion to the fourth power of the temperature is emitted. A device configured to detect a wet state of a horny coat by monitoring this infrared light has been proposed (Japanese Unexamined Patent Application Publication No. 10-118108). In this method, only a single waveform of infrared light corresponds to the entire part of a horny coat C, and thus only information about an average wet state of the whole horny coat is obtained. In reality, however, bleeding of a tissue fluid separately occurs in the horny coat in the form of islands. Therefore, it is preferable that information about wet states at each position of a horny coat be obtained.

By using the imaging device 70 or the two-dimensional light-receiving element array 50 of the present invention, information about wet states at each position of a horny coat can be clearly obtained. A tissue fluid contains a large amount of moisture. It is possible to detect a transition of the moisture distribution of a whole horny coat when bleeding of the tissue fluid transiently occurs during an operation. It is obvious that such a detection provides valuable information on a wet state of a horny coat. In this case, a pulse width of the pulse laser is on the order of 10 nanoseconds (ns), and it is important to detect a moisture distribution within several milliseconds (ms) to 1,000 milliseconds thereafter. After an ArF excimer laser shot, mushroom-shaped atomization due to evaporation of a horny coat is generated within about 10 nanoseconds. It is necessary to follow and detect the moisture distribution on the surface of the horny coat on the order of several milliseconds to several tens of milliseconds so that an effect of this atomization can be minimized.

Figure 20:
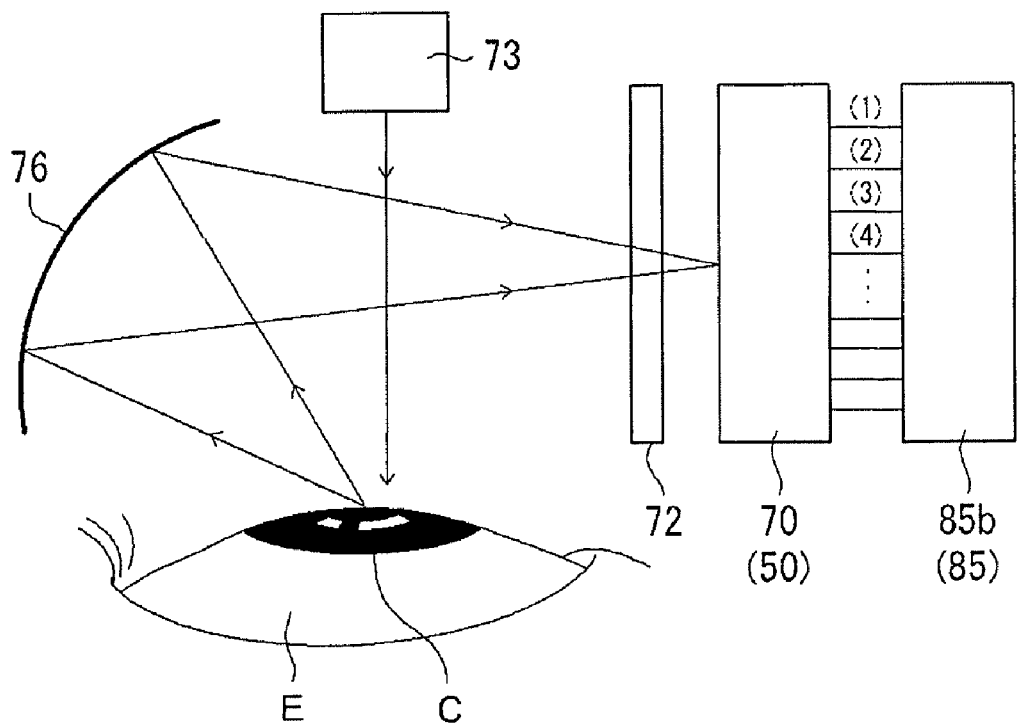
FIG. 20 is a view showing a horny coat moisture distribution detector used in keratomileusis, according to a sixth embodiment of the present invention.
Figure 21:
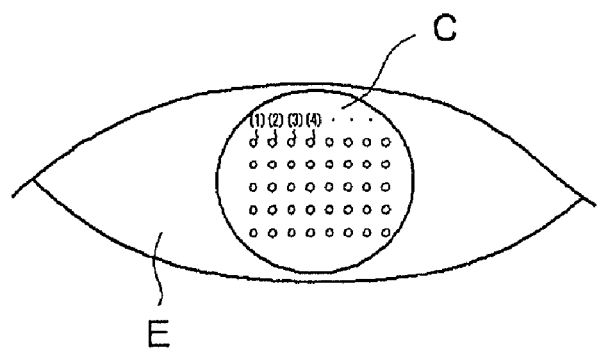
FIG. 21 is a view showing positions on a horny coat at which moisture is detected.

FIGS. 20 and 21 are views illustrating a device configured to detect a moisture distribution of a horny coat during an operation according to a sixth embodiment of the present invention. A light source 73 is disposed so as not to overlap with an output portion (not shown) of an ArF excimer laser. In FIG. 20, an optical system is configured to form an image of a horny coat on an imaging device 70 or a two-dimensional light-receiving element array 50. In a portion of the horny coat containing a large amount of moisture, an output voltage of a pixel or a light-receiving element is small (dark), and in a portion of the horny coat containing a small amount of moisture, the output voltage thereof is large (bright). Immediately after an ArF excimer laser shot, a waveform (temporal transition) of the output voltage of each pixel of the imaging device 70 or the two-dimensional light-receiving element array 50 is input to a processor 85b included in a control unit 85 and stored. The pixels of the imaging device 70 or light-receiving elements 10 of the two-dimensional array are assigned positions of a horny coat C that are finely divided, as shown in FIG. 21.

Figure 22A:
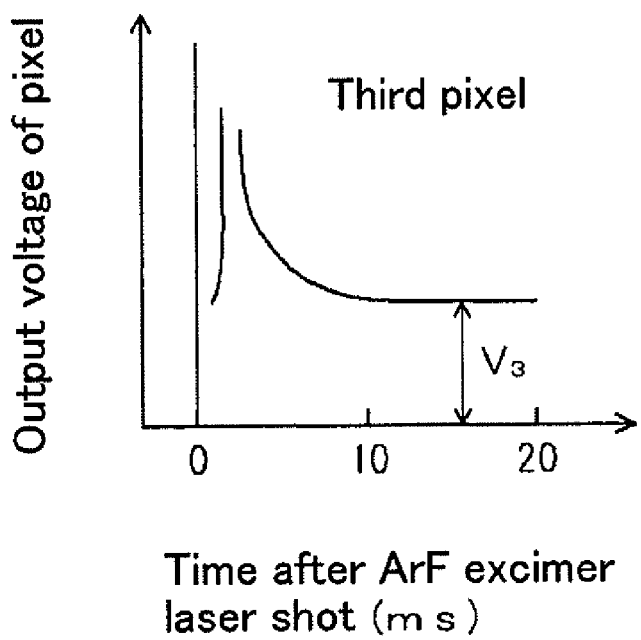
FIG. 22A is a graph showing an example of a waveform of near-infrared light (a transition in the intensity with time) at a position on the horny coat shown in FIG. 21, and shows a waveform at the position of a third pixel.
Figure 22B:
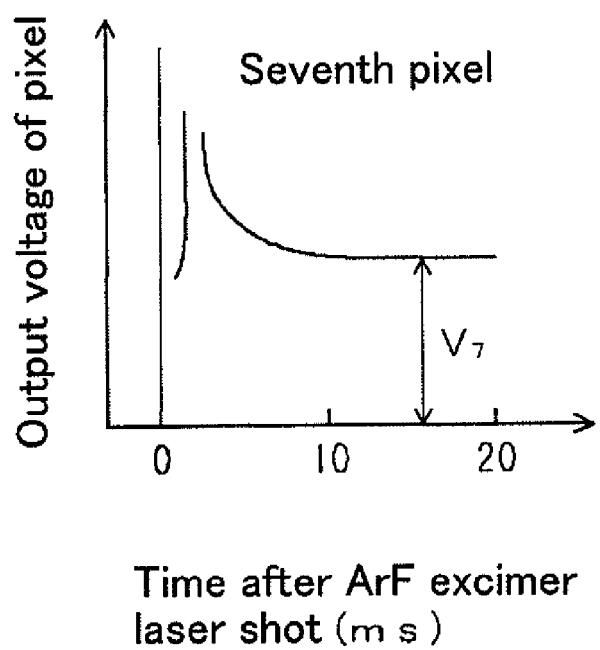
FIG. 22B is a graph showing an example of a waveform of near-infrared light (a transition in the intensity with time) at a position on the horny coat shown in FIG. 21, and shows a waveform at the position of a seventh pixel.

FIGS. 22A and 22B show assumed output voltage waveforms of pixels immediately after an ArF excimer laser shot. FIG. 22A shows a waveform of a third pixel, and, for example, a voltage after 15 ms is assumed to be $V_3$. FIG. 22B shows a waveform of a seventh pixel, and a voltage after 15 ms is assumed to be $V_7$. Since $V_7$ is larger than $V_3$, the moisture concentration at the position of the third pixel is higher than that of the seventh pixel. This result shows that, in the horny coat at the position corresponding to the third pixel, the proportion of a tissue fluid is high, and the proportion of collagen is decreased. As a result, it is expected that the absorption rate of the ArF excimer laser is decreased at the position corresponding to the third pixel.

The imaging device 70 according to the present invention can form pixels at a density that is more than sufficient to medically know the wet state of each position of a horny coat. In addition, crosstalk between adjacent pixels is small and a dark current can also be significantly decreased. Furthermore, as described above, by forming a layer for adjusting the concentration distribution of a diffused impurity using InGaAs, the response time can be reduced. Accordingly, an output voltage waveform can be obtained with a high following property and a high accuracy in each of the pixels. All such waveforms of the pixels are collected, and the moisture concentrations are plotted on a map of a horny coat. Thus, a bleeding state of the whole horny coat immediately after an ArF excimer laser shot can be known.

(3) Seventh Embodiment

Moisture Distribution Image of Face

Figure 23:
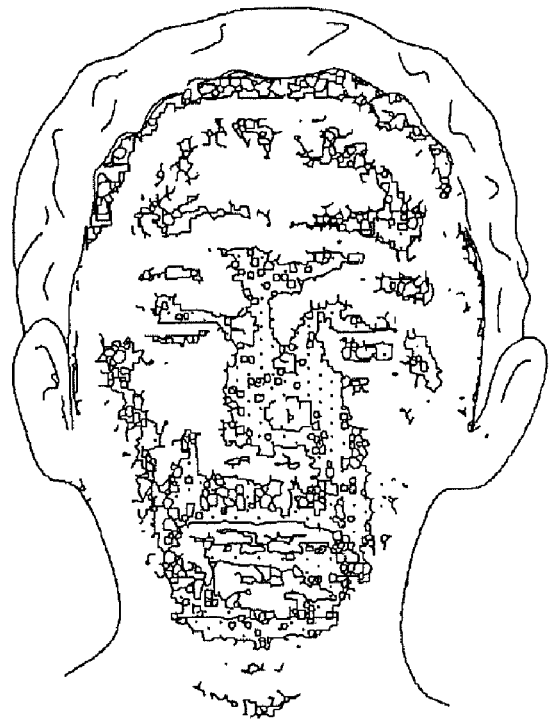
FIG. 23 is a view showing a moisture distribution image of a face according to a seventh embodiment of the present invention.

It is not possible to make clear what utility could be medically or cosmetically provided by a moisture distribution image of the face. However, as shown in FIG. 23, a sharp moisture distribution image of the face can be obtained with the imaging device 70 according to the present invention. Furthermore, as described above, capturing a moisture distribution image of the face involves a problem of eye-safe. According to the imaging device 70 of the present invention, a sharp image can be obtained even with a weak signal, and thus the SWIR cosmic light can be used without using a light source. Alternatively, in the case where a light source is used, a light source having a low emission intensity can be used. Therefore, it is easy to overcome the problem of eye-safe.

(4) Eighth Embodiment

Moisture Detection of Biological Body

Figure 24:
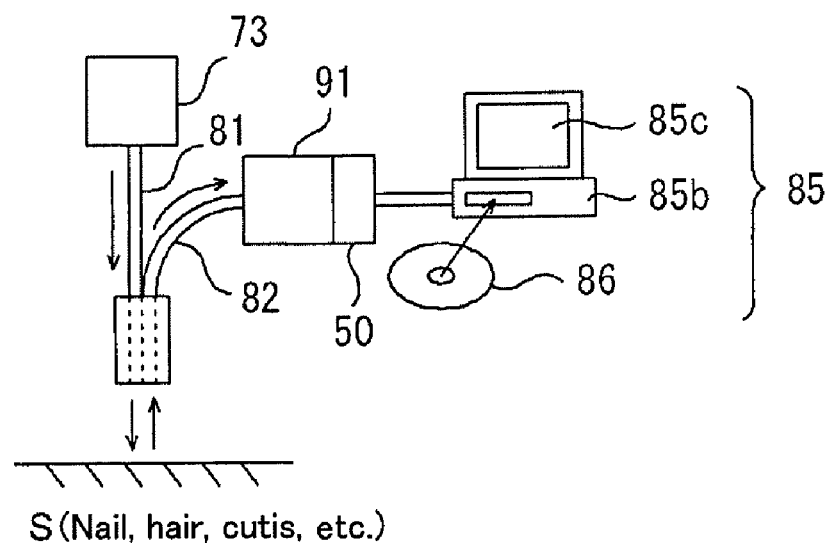
FIG. 24 is a view showing a biological body moisture detector according to an eighth embodiment of the present invention.

FIG. 24 is a view showing a moisture detector 100 for a biological body S such as nail, hair, or cutis according to an embodiment of the present invention. In FIG. 24, it is assumed that reflected light is used for detection, but transmitted light may be alternatively used. A light source 73 emits light including a light component having a wavelength at about 1.4 µm and a light component having a wavelength at about 1.9 µm. The light passing through an optical fiber 81 for light projection is incident on the biological body S. The light reflected from the biological body S passes through an optical fiber 82 for light reception, and is input to a spectral detector 91. In the spectral detector 91, the light is separated with a spectroscope such as a diffraction grating, and is received by, for example, a one-dimensional light-receiving element array 50 for different wavelength ranges to measure intensities of reflected light components. In a control unit 85, an operation unit 85b determines the moisture content on the basis of the intensities of the reflected light components having different wavelength ranges using a calibration curve that is stored in advance, the results are displayed on a display unit 85c and stored in a recording medium 86.

In the moisture detector 100 shown in FIG. 24, the biological body S is irradiated with light having continuous wavelengths, and thus biological components other than water can be detected at the same time. For example, urea contained in a cosmetic cream penetrates through the skin to cure skin problems and skin roughness and to improve moisturizing action. Accordingly, in order to evaluate the permeability of urea, urea and moisture are measured at the same time after a predetermined time from an application of the urea. Water is detected with light having a wavelength in the range of, for example, 1.85 to 1.95 µm and urea is detected with light having a wavelength in the range of, for example, 1.95 to 2.0 µm. A plurality of light-receiving elements (plurality of individual light-receiving elements 10 or a one-dimensional light-receiving element array 50) are arranged so as to correspond to light components having different wavelength ranges, the light components being separated in the spectral detector 91. Consequently, an output voltage with a reduced amount of noise can be obtained for light components having various wavelengths. In preparation of a calibration curve using a standard sample, and in measurement in moisture detection of a test object, highly accurate data can be obtained. Accordingly, a quantitative moisture detection with a high accuracy can be performed for the test object. In the above embodiments, eyes, face, cutis, nail, and hair are cited as examples, but the moisture detector of the present invention can be used for other body parts etc. The biological bodies are not limited to those of the human, and the moisture detector of the present invention can be used for other organisms.

4. Product/Material Moisture Detector

(1) Ninth Embodiment

Application to Automatic Oil-Draining Device

Figure 25:
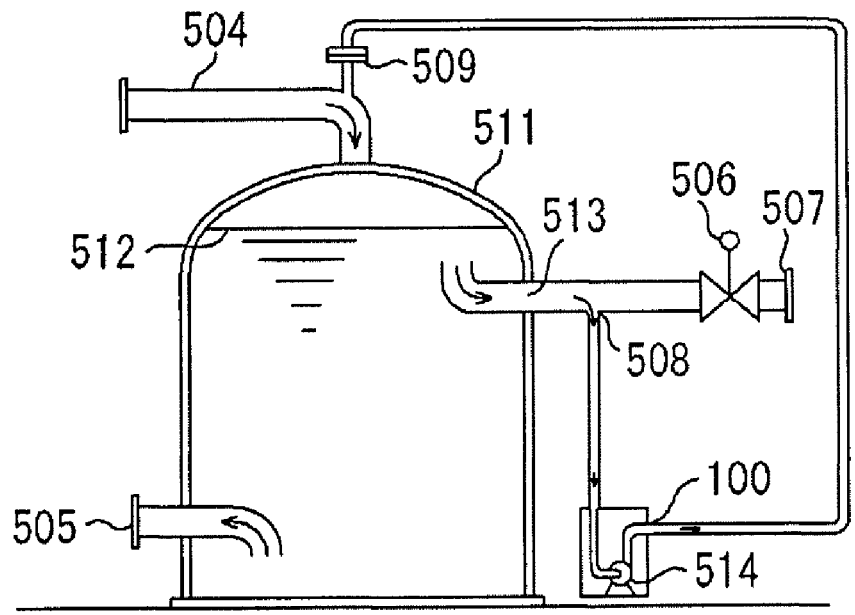
FIG. 25 is a view illustrating an automatic oil-draining device according to a ninth embodiment of the present invention.

FIG. 25 is a view illustrating an automatic oil-draining device. This oil-draining device is used for automatically draining oil in an oily water separator 511. In FIG. 25, oil and water flow from a raw water inlet 504 to the oily water separator 511. Since the oil is lighter than the water, the oil is mainly present near an oil-water boundary surface 512. A drain oil inlet 513 is provided at a position slightly lower than the liquid surface. The oil and the water flowed from this drain oil inlet 513 are sent to a sensor outlet 509 connected to the raw water inlet 504 through a sensor inlet 508 and a pump 514 provided in an on-line sensor (moisture detector) 100.

Figure 26:
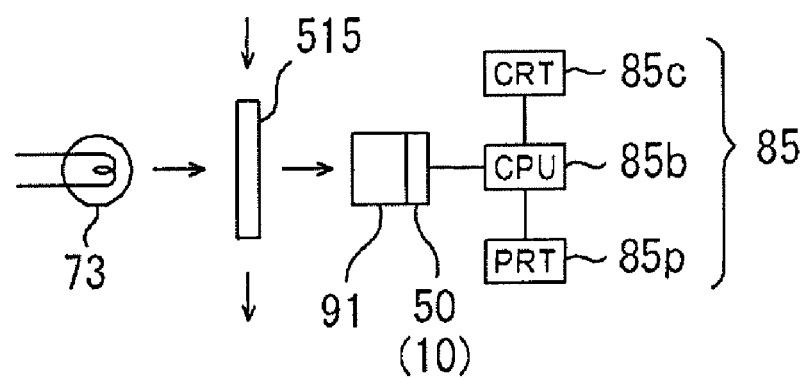
FIG. 26 is a view showing a product/material moisture detector according to the ninth embodiment of the present invention.

FIG. 26 is a view showing the structure of the moisture detector (on-line sensor) 100 according to a ninth embodiment of the present invention. The oil sent from the pump 514 shown in FIG. 25 passes through a flow cell 515 and sent to the sensor outlet 509 shown in FIG. 25. The flow cell 515 is made of quartz, and light emitted from a light source 73 transmits through the flow cell 515. Among light components passing through the oil and the water, light components having predetermined wavelengths are absorbed. These light components include information of oily water. A spectroscope 91 is disposed downstream of the flow cell 515, and a light-receiving element 10 is disposed downstream of the spectroscope 91 for each separated wavelength region. Instead of individual light-receiving elements, a one-dimensional or two-dimensional light-receiving element array 50 may be disposed. In the light-receiving element 10, light components having a wavelength of about 1.4 µm and about 1.9 µm, which are absorbed by the water in the oily water in the flow cell 515, provide low output voltages accordingly.

Electrical signals output from the light-receiving elements 10 or the light-receiving element array 50 are sent to a CPU 85b of a control unit 85, and a moisture concentration is calculated. The moisture concentration is displayed on a display unit 85c or printed by a printer 85p according to need. When the water ratio is a predetermined value or less (for example, 20% or less), a drain oil valve 506 shown in FIG. 25 is opened by an electrical signal to drain the oil from a drain oil opening 507. On the other hand, when the water ratio higher than the predetermined value, the water in the oily water separator 511 is drained from a treated water outlet 505.

According to the moisture detector 100, the water ratio in an oil-water mixed liquid can be determined with a high accuracy. In particular, a plurality of light components having different wavelengths are received after being absorbed by water, and thus the water ratio can be determined with a higher accuracy by statistically processing the output signals.

(2) Tenth Embodiment

Detection of Moisture and Cellulose in Paper Product

Figure 27:
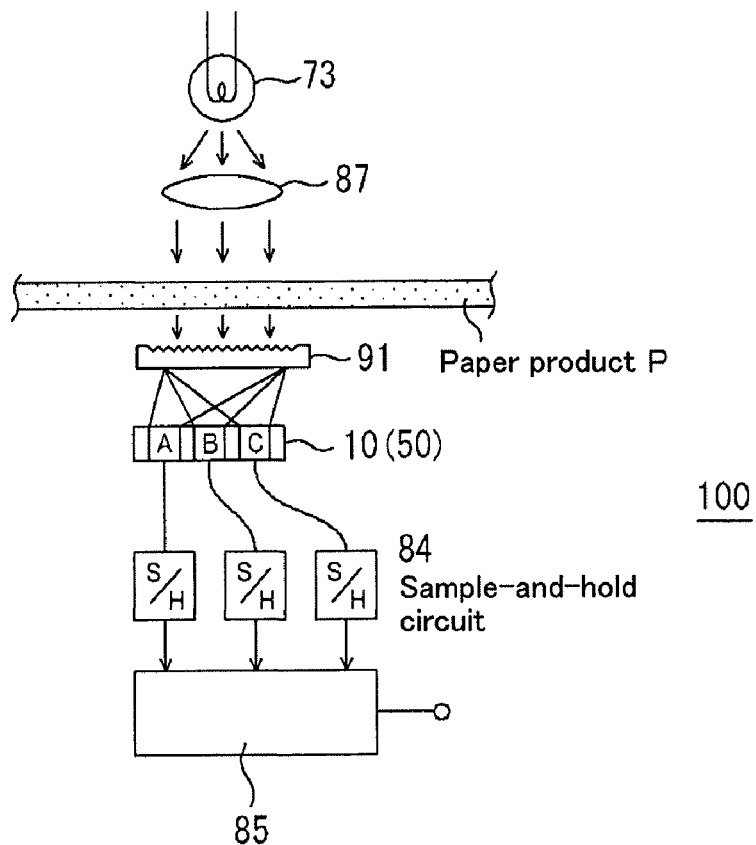
FIG. 27 is a view showing a product/material moisture detector (moisture/cellulose detector) according to a tenth embodiment of the present invention.

FIG. 27 is a view showing a device configured to detect moisture and cellulose in a paper product according to a tenth embodiment of the present invention. In the device shown in FIG. 27, three light components A, B, and C having different wavelengths:

A: A represents a light component that is not absorbed by water or cellulose. For example, A represents a light component having a wavelength of 1.8 µm.

B: B represents a light component that is absorbed by water. For example, B represents a light component having a wavelength of 1.94 µm.

C: C represents a light component that is absorbed by cellulose. For example, C represents a light component having a wavelength of 2.1 µm.

A light source 73 emits light containing the above light components A, B, and C. The light is converted to parallel rays by a condenser lens 87 and incident on a paper product P which is a test object. The light passing through the paper product P is separated by a spectroscope 91 such as a diffraction grating, and received by light-receiving elements 10 corresponding to different wavelengths. The plurality of light-receiving elements 10 may be constituted by individual light-receiving elements or a one-dimensional light-receiving element array 50. Each of the light-receiving elements 10 outputs a signal voltage. The signal voltage is held in a sample-and-hold circuit 84, and is input to a control unit 85 including a memory unit, an operational circuit, and the like. In the control unit 85, the moisture content and the cellulose content are calculated by combining the measured values with calibration curves of moisture and cellulose that are input in advance. Consequently, physical properties of the paper product P can be known to determine the brand or the like.

According to the above product/material moisture detector 100, a test object is irradiated with a plurality of light components having different wavelengths at the same time, and the light components can be rapidly received to output information. In this case, a dark current etc. is low, and thus signals having a high S/N ratio can be output. In addition, for example, in the case where the light-receiving elements 10 are composed of a one-dimensional array, each of the light-receiving elements includes a pn-junction formed by selective diffusion of a p-type impurity and is separated from adjacent light-receiving elements. That is, since isolation trenches formed by mesa-etching are not provided, signals with low noise can be output. The above light-receiving elements have a sensitivity to 3 μm at the long-wavelength side, and thus the above light component C can be satisfactorily received with a high sensitivity. Furthermore, the wavelengths are not limited to those of the above light components A, B, and C. The moisture detector 100 of this embodiment has a degree of freedom in which light components having appropriate wavelengths can be selected within 3 μm.

(3) Eleventh Embodiment

Moisture Detector for Dehydrated Cake of Polluted Sludge

Figure 28:
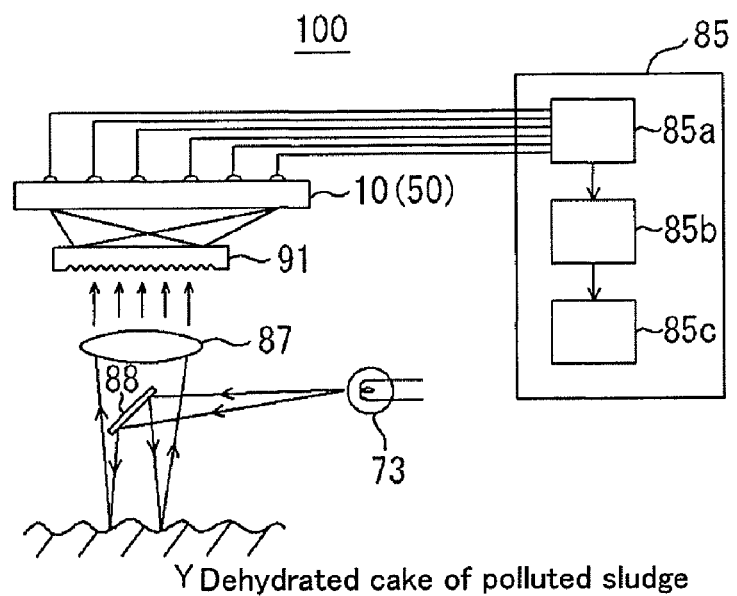
FIG. 28 is a view showing a product/material moisture detector (polluted sludge cake's moisture detector) according to an eleventh embodiment of the present invention.

FIG. 28 is a view showing a product/material moisture detector 100 according to an eleventh embodiment of the present invention. There are various type of polluted sludge. For example, in sewage sludge, several types of polluted sludge such as primary sedimentation sludge, excess sludge, digested sludge, and mixed sludge thereof are generated depending on treatment processes. Furthermore, polluted sludge sent to a dehydration treatment process changes every moment. In this case, some dehydrated cakes have an absorption that overlaps with light having a wavelength of the absorption band of water depending on a property of the dehydrated cakes. In such a case, for example, a phenomenon in which the overlapping portion changes from an absorption wavelength of water to another absorption wavelength of water usually occurs in accordance with a change in the property of the dehydrated cake. Accordingly, it is necessary to appropriately select a wavelength used for determining the moisture content in a dehydrated cake in accordance with the property of the dehydrated cake.

FIG. 28 is a view showing the product/material moisture detector 100 according to an embodiment of the present invention. In the moisture detector 100 of this embodiment, six light components having wavelengths Λ1 to Λ6.
Λ1: 1,320 nm (absorption by moisture and oil (S1, X1))
Λ2: 1,360 nm (reference light (R))
Λ3: 1,450 nm (absorption by moisture (S2))
Λ4: 1,540 nm (absorption by moisture and protein (S3, X2))
Λ5: 1,590 nm (absorption by moisture and protein (S4, X3))
Λ6: 1,760 nm (absorption by oil (X4))

For a test object, voltage signals of the above wavelengths are obtained. As for symbols such as S1 added to each of the wavelengths, S1 to S4 mean that signals from the wavelengths are used as data for detecting moisture, and X1 to X4 mean that signals from the wavelengths are used as data for determining a property.

Referring to FIG. 28, a light source 73 emits light including light components having the above wavelengths Λ1 to Λ6. The light reflected from a reflector plate 88 is incident on a dehydrated cake Y used as a test object. The light reflected from the dehydrated cake Y is converted to parallel rays by a condenser lens 87 and separated into the above wavelength ranges by a spectroscope 91 such as a diffraction grating. A plurality of light-receiving elements 10 are arranged so as to correspond to the spectrally separated wavelengths and receive light components having the above wavelengths to convert them to electrical signals. These light-receiving elements 10 may be a one-dimensional array installed in an imaging device 50. The electrical signals obtained from the above wavelengths are input to an input interface 85a of a control unit 85. Subsequently, the signals are operated in an operation unit 85b having a memory unit to calculate a moisture ratio. The moisture is displayed on a display unit 85c.

A detailed description of a scheme of the above-mentioned "light→electrical signals→signal processing" is omitted, but the outline thereof is as follows. First, the property of the test object is determined on the basis of voltage signal data of X1 to X4 above. A coefficient of a regression formula has already been determined so as to correspond to the determination result. By inputting voltage signal data of S1 to S4 above to the regression formula, the moisture ratio can be determined. According to the whole scheme, there are several types of regression formulae for calculating the moisture content, and an appropriate regression formula for calculating the moisture content is selected in accordance with the property of the test object. Accordingly, an adequate moisture content of a dehydrated cake of polluted sludge can be constantly determined.

In the light-receiving elements 10 or the one-dimensional array 50, a dark current is low and crosstalk between adjacent light-receiving elements does not occur. Therefore, electrical signals having a high S/N ratio can be obtained to increase the accuracy of the above calculation of the moisture content. In addition, since the upper limit of the sensitivity is a wavelength of 3 μm, the wavelength used for determining the property of the dehydrated cake Y of polluted sludge can extend to a longer wavelength, thereby increasing the degree of freedom of a wavelength selection in the scheme of this method of measuring a moisture content.

(4) Twelfth Embodiment

Detection of Moisture in Coal

Figure 29:
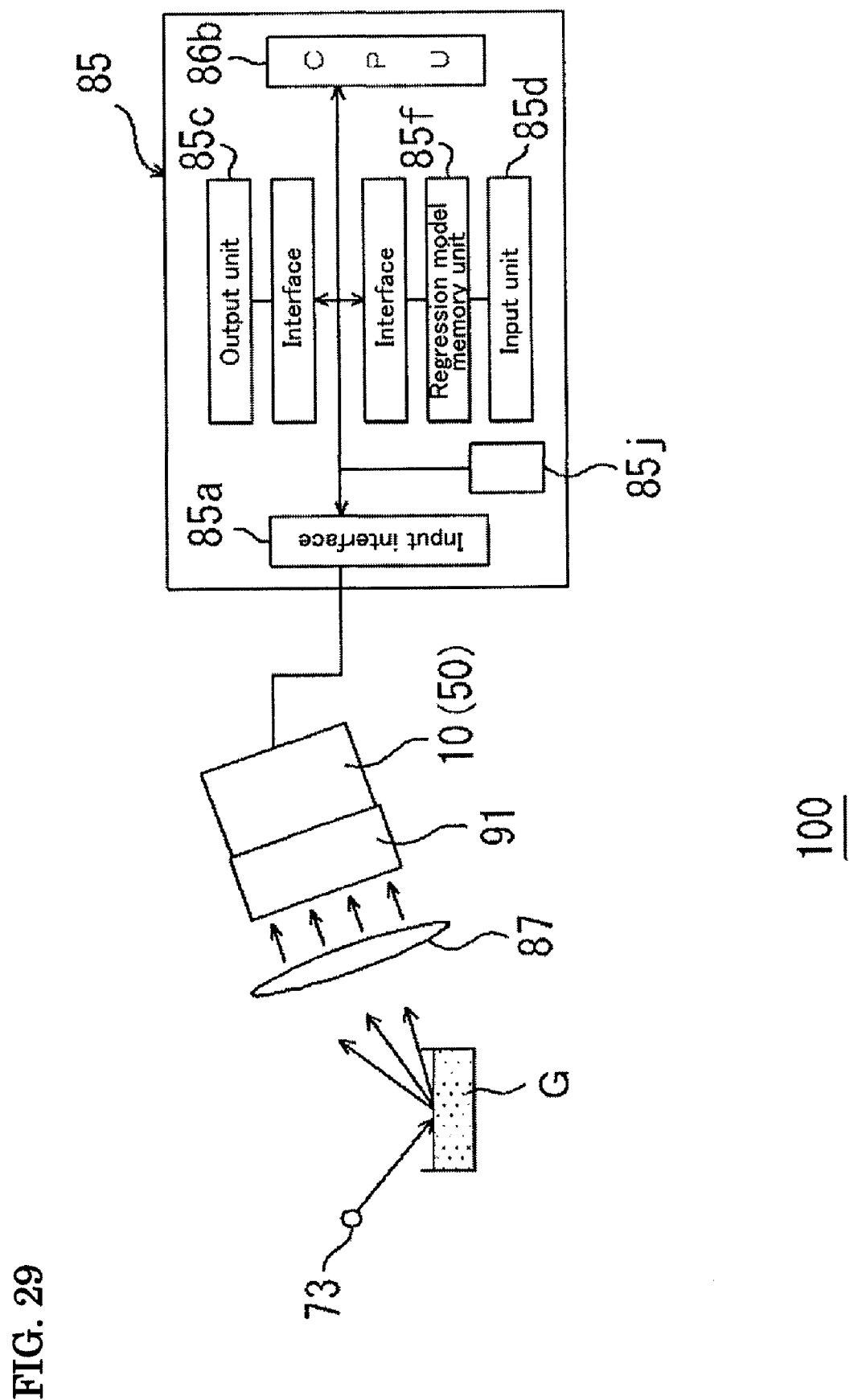
FIG. 29 is a view showing a product/material moisture detector (coal's moisture detector) according to a twelfth embodiment of the present invention.

FIG. 29 is a view showing a moisture detector for coal according to a twelfth embodiment of the present invention. Light emitted from a light source 73 is reflected at coal G, converted to parallel rays by a condenser lens 87, and separated by a spectroscope 91. The coal G is produced by hardening a coal powder under pressure. Instead of the reflected light of the coal, transmitted light may be used. Light-receiving elements 10 or a light-receiving element array 50 is arranged in order that each of the separated light components having different wavelengths is received by a corresponding light-receiving element. Electrical signals output from the light-receiving elements 10 or a light-receiving element array 50 are read out to a control unit 85. The electrical signals are input to an input to an interface 85a of the control unit 85. A spectrum-forming unit 85j of the control unit 85 forms a near-infrared spectrum on the basis of the signals output from the light-receiving elements 10 or the light-receiving element array 50. The control unit 85 includes, as main units, an operation unit 85b, an input unit 85d, a regression model memory unit 85f, and a display unit 85c. The control unit 85 also includes an interface (memory driving circuit) of the regression model memory unit, an interface of an output unit, and the like.

In the control unit (coal moisture estimation processor) 85, a predetermined regression model is input from the input unit 85*d* in advance to memory the regression model in the regression model memory unit 85*f*. The regression model is a model in which the relationship between the above-mentioned near-infrared spectrum and moisture values is digitalized. Preprocessing such as an averaging process, a first order differential, a second order differential, or the like is preferably performed for the near-infrared spectrum formed in the spectrum-forming unit 85*j*, according to need. In order to determine the moisture values from peak values of the near-infrared spectrum obtained after such processing, a multiple regression formula (model) is formed in advance as described above. For this purpose, a multiple regression formula is determined is advance using a coal standard sample with a known moisture value. By performing an operation by substituting this multiple regression formula with peak values of the measured peak wavelengths, the moisture vale of coal which is a test object can be determined. The moisture detection results are shown in the display unit 85*c* via the interfaces.

In the light-receiving elements 10 or the light-receiving element array 50, a dark current is low and crosstalk does not occur. Therefore, signals having a high S/N ratio can be obtained. Accordingly, in preparing the multiple regression formula of the standard sample with a known moisture value, a multiple regression formula having high reliability can be determined on the basis of highly reliable light-receiving signal data. In addition, a highly reliable near-infrared spectrum with low noise can be obtained from coal of a test object. Consequently, moisture in coal can be detected with a high accuracy.

(5) Thirteenth Embodiment

Moisture Detector for Clothes in Drier

Figure 30:
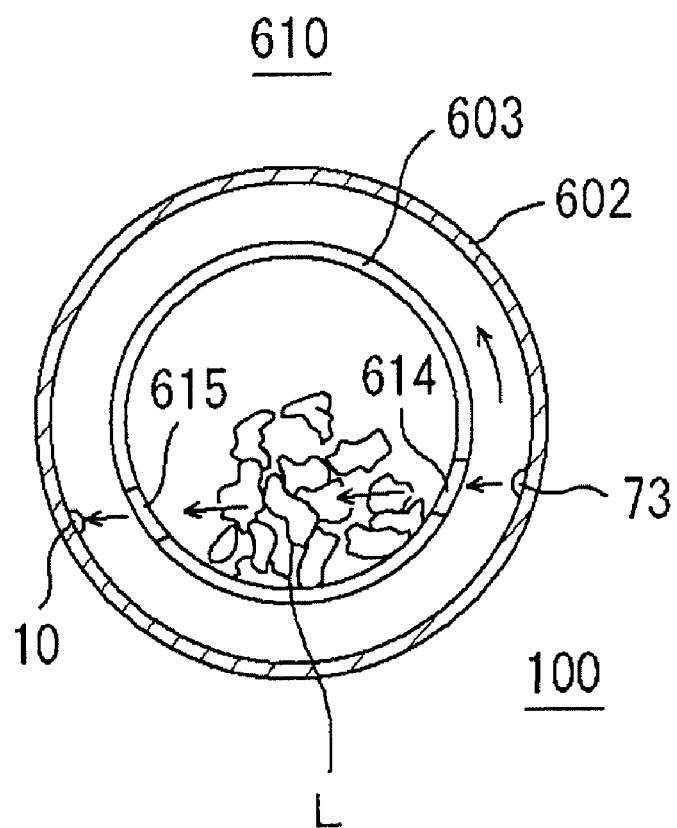
FIG. 30 is a view showing a moisture detector for clothes in a clothes-holding drum according to a thirteenth embodiment of the present invention.

FIG. 30 is a view showing a moisture detector 100 for clothes L during drying in a cloth drier 610. An outer tub, a blower, and other components in this cloth drier 610 are omitted. The clothes L after washing are placed in a clothes-holding drum 603 in a wet state and then rotated. An inner tub 602 is disposed outside the clothes-holding drum 603, and the outer tub (not shown) is disposed outside the inner tub 602. In the moisture detector 100 for the clothes L during drying, a light-emitting diode (LED) or the like is preferably used as a light source 73 of near-infrared light from the standpoint that a limited space is utilized. Regarding the wavelengths of light emitted from the LED, the LED that emits light having a wavelength of about 1.4 μm or about 1.9 μm is preferable. The rotatable clothes-holding drum 603 includes windows 614 and 615. The light source 73, the window 614, the window 615, and a light-receiving element 10 are disposed so as to be arranged in a straight line at a certain moment during the rotation.

Figure 31:
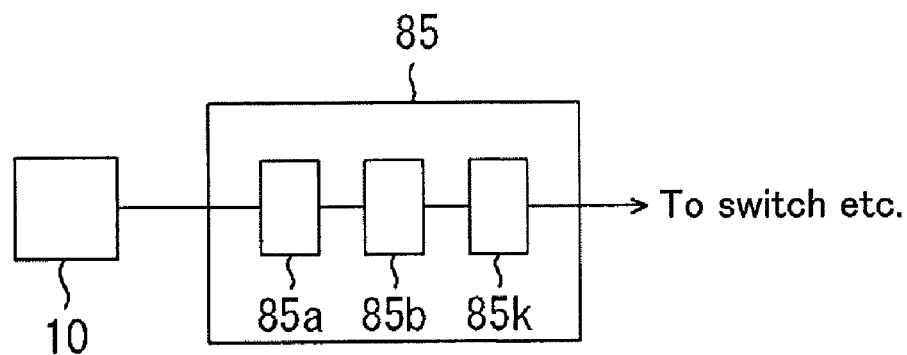
FIG. 31 is diagram showing a processing circuit of electrical signals of a light-receiving element shown in FIG. 30.

FIG. 31 is diagram showing a control unit 85 used for reading out an electrical signal and controlling a switch of a driving motor or the like when light is received by the light-receiving element 10. The control unit 85 is preferably mounted on a printed circuit board. The electrical signal output from the light-receiving element 10 is read out to an interface 85*a*, and the moisture content and the degree of dryness are calculated in an operation unit 85*b*. A controller 85*k* performs an on/off control of a switch of a driving motor (not shown) or the like on the basis of the degree of dryness.

Thus, moisture in the clothes during drying in the cloth drier can be detected. The time required for drying in the cloth drier can be minimized, thereby eliminating wasteful time and electric power. In addition, damage of clothes due to excessive drying can be prevented.

The above light-receiving element 10 has a high light-receiving sensitivity at a wavelength of 1.95 μm, and a dark current in the light-receiving element 10 is low. Accordingly, an electrical signal having a high S/N ratio can be output even with weak light. Therefore, the state of dryness can be known by receiving transmitted light at a position suitable for detecting the state of dryness or the state of moisture of the clothes accommodated in the rotating clothes-holding drum 603. In the above embodiments, examples of oily water, coal, polluted sludge cakes, paper products, and clothes have been described. However, the examples are not limited thereto. The moisture detector of the present invention can be applied to a film, a resin, a diaper, and other products.

EXAMPLES

Examples Regarding the Structure of Semiconductor Light-Receiving Element Array

Figure 32:
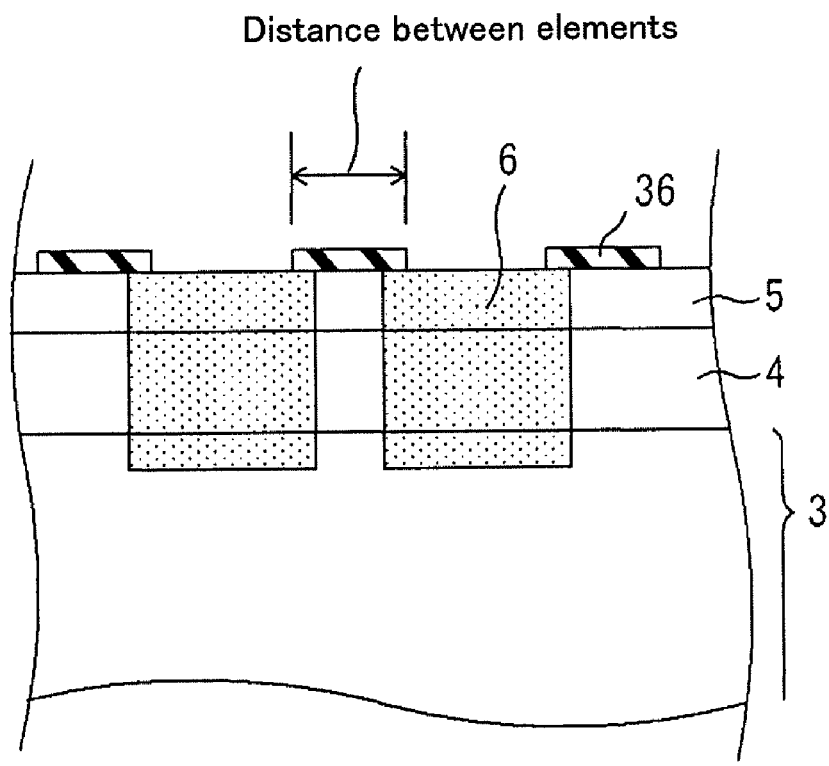
FIG. 32 is a partial cross-sectional view of a light-receiving element array used in an Example.

The minimum distance between elements or pixel pitch of a light-receiving element array of the present invention was examined by an Example using a light-receiving element array shown in FIG. 32. The distance between light-receiving elements or the pixel pitch is the width of a non-opening portion of a SiN selective diffusion mask pattern 36, as shown in FIG. 32. After selective diffusion of Zn, a p-side electrode 11 made of AuZn and an n-side electrode 12 made of AuGeNi were formed. In the light-receiving element array shown in FIG. 3, a semi-insulating substrate doped with Fe is used as the InP substrate 1, and thus the n-side electrode 12 is provided on the buffer layer 2 containing an impurity at a high concentration. However, when an n-type InP substrate 1 is used as shown in FIG. 1, the n-side electrode 12 may be provided on the reverse face of the substrate 1 or on an n-type semiconductor layer (e.g., the buffer layer 2) adjacent to the substrate at the surface side of the substrate. In this Example, a reverse bias voltage of 5 V was applied between the p-side electrode 11 and the n-side electrode 12 of the light-receiving element array shown in FIG. 3 to measure a dark current. As for the thickness of the InP window layer 5, light-receiving element array samples including an InP window layer 5 having a thickness of 0.6 μm and samples including an InP window layer 5 having a thickness of 1.6 μm were produced. As for the distance between elements, seven types of samples in which the distance between elements was varied in the range of 3 to 20 μm were produced. A dark current was measured for each of the light-receiving element array samples. The thickness of the layer 4 for adjusting the concentration distribution of a diffused impurity was 1 μm.

Figure 33:
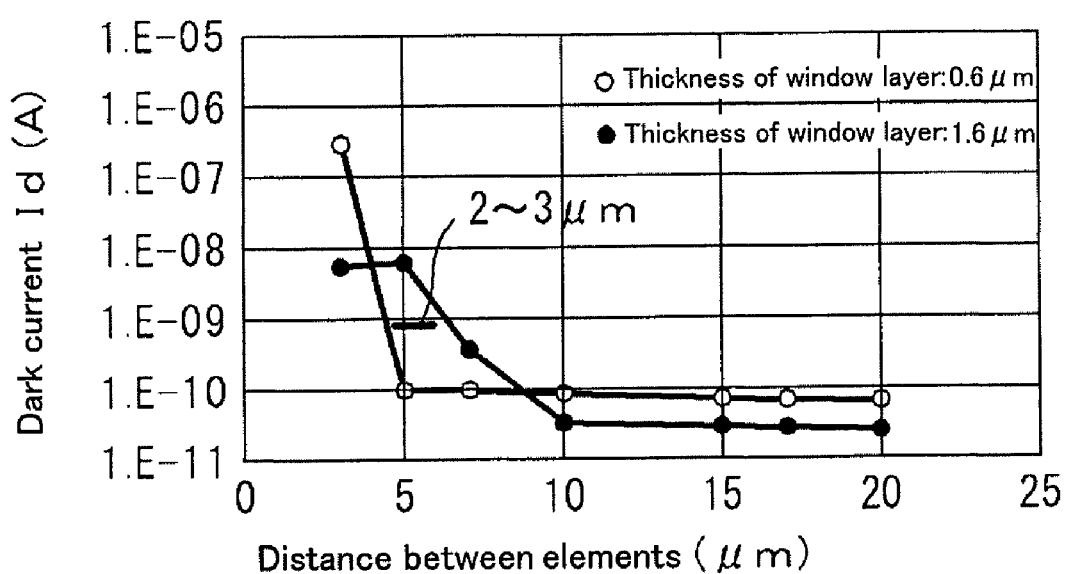
FIG. 33 is a graph showing the relationship between a dark current and a distance between elements measured in the Example.

The results are shown in FIG. 33. Referring to FIG. 33, in the case where the thickness of the InP window layer 5 was small; 0.6 μm, even when the distance between elements or the pixel pitch was decreased to 5 μm, the dark current was $1 \times 10^{-10}$ A (ampere). In contrast, in the case where the thickness of the InP window layer 5 was 1.6 μm, the diffusion of Zn extended in the lateral direction, and thus the dark current of $1 \times 10^{-10}$ A could not be realized at a distance between elements of 7 μm or less. However, according to this Example, it was confirmed that the distance between elements could be decreased to 5 μm by decreasing the thickness of the InP window layer 5 to 0.6 μm and forming the layer 4 for adjusting the concentration distribution of the diffused impurity.

Figure 34:
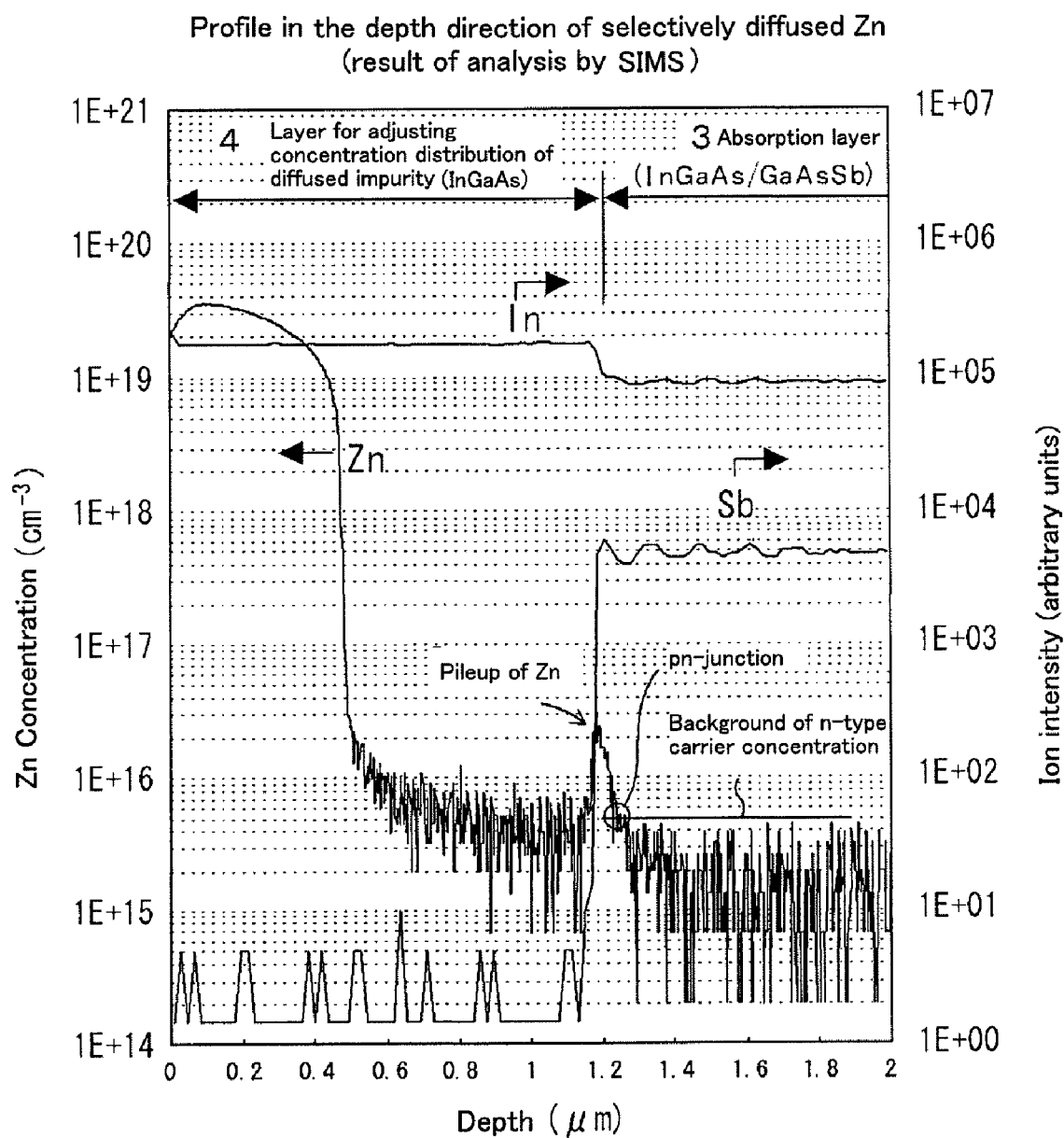
FIG. 34 is a graph showing a Zn concentration distribution in the depth direction in an Example.

The effect of the layer 4 for adjusting the concentration distribution of a diffused impurity was verified by analyzing the concentration distribution of Zn in the depth direction by SIMS. FIG. 34 shows a concentration distribution of Zn in the depth direction. Referring to FIG. 34, at the interface between the layer 4 for adjusting the concentration distribution of the diffused impurity and the absorption layer 3, a peak value of pileup of Zn was decreased to $5\times10^{16}$ cm$^{-3}$ or less. Accordingly, in a pn-junction formed at an intersecting position (shown by the circle in the figure) of the background of an n-type carrier concentration of the absorption layer 3 and the Zn concentration, the Zn concentration can be reliably decreased and degradation of crystallinity etc. can be prevented. This arrangement of the layer 4 for adjusting the concentration distribution of the diffused impurity allows the multiquantum well structure of the absorption layer to achieve the original function thereof.

Embodiments and Examples of the present invention have been described above. However, the embodiments and the examples of the present invention disclosed above are only illustrative, and the scope of the present invention is not limited to the specific embodiments of the invention. It is to be understood that the scope of the present invention is defined in the appended claims and includes equivalence of the description of the claims and all changes within the scope of the claims.

What is claimed is:

1. A moisture detector configured to detect moisture in a test object, comprising:
    a light-receiving element including a Group III-V semiconductor laminated structure including an absorption layer having a pn-junction, or an array of the light-receiving elements,
    wherein the absorption layer has a multiquantum well structure composed of a Group III-V semiconductor,
    the pn-junction is formed by selectively diffusing an impurity element into the absorption layer,
    the concentration of the impurity in the absorption layer is $5\times10^{16}$/cm$^3$ or less, and
    the moisture detector has a sensitivity to light having at least two wavelength ranges selected from a first wavelength range of 1.35 μm or more and less than 1.8 μm, a second wavelength range of 1.8 μm or more and less than 2.0 μm, and a third wavelength range of 2.5 μm or more and less than 3.0 μm, the light being reflected from the test object, and detects moisture using light in at least one wavelength range selected from the wavelength ranges in which the moisture detector has the sensitivity.

2. The moisture detector according to claim 1,
    wherein the Group III-V semiconductor laminated structure is disposed on a Group III-V semiconductor substrate, and includes a Group III-V semiconductor layer for adjusting the concentration distribution of the diffused impurity, the layer being disposed on a surface of the absorption layer, the surface being opposite the substrate, and
    the bandgap energy of the layer for adjusting the concentration distribution of the diffused impurity is smaller than the bandgap energy of the Group III-V semiconductor substrate.

3. The moisture detector according to claim 2, wherein, in the layer for adjusting the concentration distribution of the diffused impurity, the concentration of the impurity element decreases from a range of $1\times10^{18}$/cm$^3$ to $3\times10^{19}$/cm$^3$ at a surface side, the surface being opposite a surface adjacent to the absorption layer, to $5\times10^{16}$/cm$^3$ or less at the absorption layer side.

4. The moisture detector according to claim 2,
    wherein the impurity element is zinc (Zn), and
    the layer for adjusting the concentration distribution of the diffused impurity is composed of InGaAs.

5. The moisture detector according to claim 2, further comprising:
    an InP window layer disposed on the layer for adjusting the concentration distribution of the diffused impurity.

6. The moisture detector according to claim 1, wherein the multiquantum well structure constituting the absorption layer has a type-II quantum well structure.

7. The moisture detector according to claim 6,
    wherein the Group III-V semiconductor laminated structure is disposed on an InP substrate, and
    the absorption layer has an InGaAs/GaAsSb multiquantum well structure or a GaInNAs/GaAsSb multiquantum well structure.

8. The moisture detector according to claim 7, wherein the InP substrate is an off-angle substrate which is tilted from (100) in the [111] direction or the [11-1] direction by 5 to 20 degrees.

9. The moisture detector according to claim 1, further comprising:
    a spectral separation unit configured to spectrally separate light, the spectral separation unit being disposed in front of or at the back of the test object;
    a plurality of the light-receiving elements or an array of the light-receiving elements arranged so as to correspond to wavelengths obtained by the spectral separation; and
    a control unit configured to perform an operation on the basis of the results of light reception performed by the light-receiving elements or the array of the light-receiving elements to calculate the moisture content.

10. The moisture detector according to claim 1, further comprising:
    an imaging device including a two-dimensional array of the light-receiving elements,
    wherein a moisture distribution image of the test object is formed with the imaging device.

11. The moisture detector according to claim 1, wherein no artificial light source is provided.

12. The moisture detector according to claim 1, wherein a supercontinuum light source (SC light source) or a light-emitting diode (LED) is used as a light source.

13. A biological body moisture detector configured to detect moisture in a biological body, comprising the moisture detector according to claim 1.

14. A natural product moisture detector configured to detect moisture in a natural product, comprising the moisture detector according to claim 1.

15. A product/material moisture detector configured to detect moisture in a product selected from the group consiting of a raw material, an intermediate product, a product, or a waste product, which is a target of an industrial activity, the moisture detector comprising the moisture detector according to claim 1.

* * * * *